(12) United States Patent
Foden et al.

(10) Patent No.: US 6,657,222 B1
(45) Date of Patent: Dec. 2, 2003

(54) PHOTON SOURCE

(75) Inventors: Clare Louise Foden, Cambridge (GB); Mark Levence Leadbeater, Cambridge (GB); Valery Talyansky, Cambridge (GB)

(73) Assignee: Kabushiki Kaisha Toshiba, Kawasaki (JP)

( * ) Notice: Subject to any disclaimer, the term of this patent is extended or adjusted under 35 U.S.C. 154(b) by 249 days.

(21) Appl. No.: 09/662,002

(22) Filed: Sep. 14, 2000

(30) Foreign Application Priority Data

Sep. 14, 1999 (GB) ............................................. 9921727

(51) Int. Cl.[7] .......................... H01L 29/40; H01L 31/00
(52) U.S. Cl. ............................. 257/13; 257/84; 359/285
(58) Field of Search ...................... 257/13, 84; 359/285

(56) References Cited

U.S. PATENT DOCUMENTS 5,101,294 A * 3/1992 Jain et al. .................... 359/285

FOREIGN PATENT DOCUMENTS

| GB | 985222 | 3/1965 |
|----|--------|--------|
| JP | 63-179582 | 7/1988 |
| JP | 1-307400 | 12/1989 |
| JP | 4-061176 | 2/1992 |

OTHER PUBLICATIONS

V.I. Talyanskii, et al., Physical Review B (Condensed Matter), vol. 56, No. 23, AN 5807043, "Single Electron Transport in a One–Dimensional Channel by High–Frequency Surface Acoustic Waves," Dec. 15, 1997 (Abstract only).

J. Kim, et al., Nature, vol. 397, pps. 500–503, "A Single–Photon Turnstile Device," Feb. 11, 1999.

C. Wiele, et al., The American Physical Society, vol. 58, No. 4, pps. R2680–R2683, "Photon Trains and Lasing: The Periodically Pumped Quantum Dot," Oct. 1998.

* cited by examiner

Primary Examiner—Jerome Jackson
(74) Attorney, Agent, or Firm—Oblon, Spivak, McClelland, Maier & Neustadt, P.C.

(57) ABSTRACT

A photon source, comprising a first semiconductor region having excess carriers with a first conductivity type, and a second semiconductor region having excess carriers with a second conductivity type, the first and second conductivity types being opposing conductivity types; means for creating a surface acoustic wave (SAW) travelling from the first semiconductor region to the second semiconductor region such that excess carriers from the first semiconductor region are carried by the wave to the second region and quantizing means for quantizing the carrier transport caused by the wave, such that the number of carriers introduced into the second semiconductor region can be controlled to the accuracy of a single carrier.

27 Claims, 12 Drawing Sheets

PHOTON SOURCE

FIELD OF THE INVENTION

The present invention relates to an optical source. More specifically, the present invention is concerned with an optical source which can be configured to emit a regular stream of single photons or a regular stream of pulses of n photons (where n is an integer).

BACKGROUND OF THE INVENTION

With the emergent fields of quantum communications, cryptography, teleportation and quantum computation, there is a need for a source which can be controlled to produce single photons or pulses of a fixed number of photons on demand. A single photon source is a particularly secure source because any unauthorised attempt to read information from this source can be detected. Also, a single photon source provides a source of strongly sub-Poissonian light which has a very high signal to noise ratio.

Recently, there have been attempts to make a single photon source based on an electron-turnstile device. This work has been reported by Kim et al, Nature, 397, 500 (1999). This device comprises a quantum dot. An AC voltage is applied to the device to drive an electron into the dot during the first half of the voltage cycle, then a hole is driven into the dot in the second half of the cycle. The hole and the electron will combine and a photon is emitted. The regular spacing of photon detection events arises due to regular pumping of electrons and holes into the quantum dot via an AC voltage. However, this device shows poor electron current quantization and, as a result, the photon "current" is noisy. The device can only operate with maximum frequencies in the MHz range which results in a low photon emission rate. Also, the device is only capable of operation at a temperature of around 50 mK.

Single photon states may also be produced using down-conversion or with a highly attenuated laser. The latter method is currently used in secure quantum communication channels. Here, the laser is set up to produce less than 1 photon per pulse such that only some pulses actually contain a photon, other contain none. However, this method is unreliable as, due to the Poissonian nature of laser light, some pulses contain more than one photon.

It has also been suggested to use a surface acoustic wave (SAW) to pump a dot which can trap a single electron and a hole (Wiele et al. Phys Rev. A, 58, R2680 (1998)). A SAW propagating on a piezo electric material is accompanied by a travelling wave of electrostatic potential. Free charge can interact with the electrostatic potential, and an acoustoelectric current can be created. If the potential is sufficiently strong, it can be used to spatially separate photo-excited electron-hole pairs where the electrons are held in the minima of the electrostatic wave, and the holes are held in the maxima Recombination is therefore suppressed, and the charges are carried along by the electrostatic potential. In the device described in the paper, a SAW is used to spatially separate photo-excited electrons and holes into alternate "wires" of electrons and holes which move with the SAW.

A "stressor" dot is provided which is a quantum dot formed by local potential minimum in a buried quantum well caused by a structure on the surface of the device. The stressor dot attempts to trap an electron and a hole from the moving "wires". The electron and hole then recombine in the stressor dot. This device suffers from the problem that a dot with the postulated properties necessary for operation has never been fabricated, and it is not clear how it would be fabricated. It is also possible that the electrons and holes may just be swept past the dot and not be trapped.

SUMMARY OF THE INVENTION

The present invention addresses the above problems, and in a first aspect provides a photon source, comprising a first semiconductor region having excess carriers with a first conductivity type, and a second semiconductor region having excess carriers with a second conductivity type opposite to that of the first conductivity type, means for creating a surface acoustic wave (SAW) travelling from the first semiconductor region to the second semiconductor region such that excess carriers from the first semiconductor region are carried by the wave to the second region and quantizing means for quantizing the carrier transport caused by the wave such that the number of carriers introduced in the second semiconductor region can be controlled to the accuracy of a single carrier.

The source can be configured such that an integer number of carriers are introduced into the second semiconductor at regular intervals. For a single photon source, the source is configured such that single carriers one at a time are introduced into the second semiconductor region at regular intervals.

The carriers of the first conductivity type can either be electrons or holes. For the purposes of this explanation, the device will be discussed only with electrons as the first carriers with the first conductivity type. However, it will be appreciated by those skilled in the art that the device could be operated with holes as the carrier with the first conductivity type.

The applicants do not wish to be bound by any specific theory as to the operation of the device. However, it is believed that the surface acoustic wave (SAW) is accompanied by a travelling wave of electrostatic potential which modulates the conduction and valence bands. The first region and the second region of the device form a P-N junction. (There may be an insulator between the p and n regions).

Electrons are carried from the n-type (first) region into the p-type (second) region by the SAW potential. The SAW forces the electrons to be carried in the minima of the electro-static potential. When electrons arrive at the p-type region, they recombine with the holes to produce photons.

The source is provided with quantizing means which quantizes the transport of the carriers carried by the SAW potential such that the number of electrons located in each SAW minimum can be controlled to the accuracy of a single carrier. The quantizing means are located such that they quantize the transport of the carriers before they are introduced into the second region. The quantizing means can control the number of carriers in the SAW minima to be 1, 2 or more if required For the purposes of this explanation, it will be assumed that a single electron is located in each SAW minimum. However, quantizing means could be controlled such that more than one electron is located in each SAW minimum. Therefore, after the SAW has travelled through the quantizing means, a single electron is introduced into the p-type region per cycle of the SAW field. The electron can then recombine with an excess hole.

In the source of the present invention, a stream of single photons or pulses of n-photons are produced by introducing or injecting carriers (an "injection event") of one type into an environment where they can combine with carriers of the opposite type to emit a photon (a "photon emission event"). To produce an ideal single photon source, there is a need for a strong correlation between the injection events and photon emission events.

A temporal uncertainty arises in the photon emission events as the carriers may not recombine immediately to emit a photon. In addition, missing events occur as the carriers may non-radiatively recombine which does not result in the emission of a photon. To achieve a strong correlation between injection events and photon emission events, the uncertainty in the time of the photon emission events must be smaller than the time between injection events. Preferably, the uncertainty is at most 50%, more preferably at most 10%, even more preferably at most 1% of the time between injection events. The requirements on uncertainty are application-dependent.

The total recombination time primarily dictates the temporal uncertainty in the photon emission events. As the electrons are introduced into the p-type region with the SAW, the SAW period is, in this case, the time difference between injection events. Generally, the radiative recombination time is greater than or equal to the SAW period, (for example, in GaAs, the radiative recombination time will be several nanoseconds and the SAW period will be typically tenths of nanoseconds). Hence, the electrons will accumulate in the p-type region. This results in the loss of correlation between injection events and photon emission events, as several photons could be emitted in a SAW cycle which injects only one electron into the p-type region The above preferred criteria also apply to an n-photon source where each cycle of the field will inject n electrons into the p-type region with the aim of producing n-photons from the p-type region for every cycle of the SAW field. The following description, will relate to a single photon source. However, it will be appreciated that the source could also be an n-photon source where n electrons are injected into the p-type region during each injection event.

The source can be configured to prevent accumulation of electrons from different injection events in the p-type region. This can be achieved in a number of different ways. For example, the source could be provided with means to control the rate of introduction of carriers of the first type into the second region, i.e. increase the time between electron injection events.

The time between electron injection events can be increased by providing a selective transmission means which is configured to transmit electrons for every m cycles of the SAW, where m is an integer greater than 1. This results in the time between electron injection events being m times the SAW period. Thus, this fulfils the requirement since m times the SAW period can be made much greater than the total recombination time.

The selective transmission means can be provided by a pulse bias means which provides a pulse bias to the quantizing means such that the quantizing means can only transmit carriers every m cycles of the SAW.

The selective transmission means could also be provided by a current splitting device, the current splitting device comprising an input, first and second outputs and control means for selecting the required output, wherein carriers emitted from the first output are injected into the second region and carriers emitted from the second output are not injected into the second region, the control means being configured to emit carriers from the first output every m cycles of the SAW. Preferably, the second output injects electrons into an n-type region which is connected to the first n-type region.

Instead of or in addition to increasing the time between injection events as described above, the second region could be configured to decrease the uncertainty in the time of the photon emission event. An upper limit can be defined for the uncertainty in the photon emission time by limiting the length of the second region in the direction of the propagation of the SAW. The length of the second region could be limited so that the time which electrons take to traverse the second region is much less than that of the SAW period. For example, the time for traversing the second region could be at most half, more preferably a tenth, even more preferably 100th of the SAW period.

If electrons are not introduced into the second region with every SAW period, (for example, if they are only being introduced every 'm' periods by a selective transmission means as described above,) the length of the second region could be increased by a factor of m.

A third region may also be provided on the opposite side of the second region to the quantization means. The third region will not have an excess of the carriers of the second type.

In addition to or instead of any of the above methods for increasing the time between injection events and decreasing the uncertainty in the time of photon emission event, the temporal uncertainty in the time of the photon emission events could also be decreased by providing means to enhance the non-radiative recombination rate. An electron which has just entered the p-type region can recombine either radiatively (which results in the emission of a photon) or non-radiatively (no emission). The total recombination time fixes an upper limit on the uncertainty in photon emission time, because any electrons which do not combine radiatively will be removed by non-radiative recombination.

It should be noted that if the non-radiative recombination rate is much smaller than the total radiative recombination rate, then the non-radiative recombination rate dictates the total recombination rate.

Such means could be impurities provided to the second region. Such impurities could be added during growth or implanted afterwards. Suitable impurities will occupy a deep level in the semiconductor band gap for example in a GaAs based semiconductor, Cr and/or Fe could be used. Also, a shallow donor such as Si could serve the same function if the temperature of the device is low enough so that an electron trapped by the shallow donor would not escape.

Such impurities may be provided in a concentration between $10^{15}$ to $10^{18}$ cm$^{-3}$.

The non-radiative recombination rate may also be increased by growing the second region at a low temperature, for example<450° C.

The device could also be configured to comprise a microcavity. To comprise a microcavity, the source is provided with reflective surfaces or layers on opposite sides of the second region. The microcavity increases the radiative recombination rate. This phenomenon is described in Bjork et al, Phys Rev. A, 44, 669 (1991). The reflective surfaces could be achieved by forming Bragg stacks on either side of the second region.

A metallic gate which can be formed on one or both sides will also serve as a reflective layer.

Preferably, the excess carriers in the first region will be provided in a two dimensional carrier gas. Similarly, it is also preferable if the carriers in the second region are also provided in a two dimensional carrier gas. However, the carriers in the first and/or second region could be contained in a bulk 3D region.

The source may be configured such that the first and second regions are located within the same semiconductor layer. Alternatively, the first and second regions may be located in different layers. For example, the first region may be a high mobility layer, and the SAW may carry excess charge through the quantizing means, when the charge is still in the high mobility layer. The second region may then be a low mobility layer and the excess carriers carried by the SAW are transported into this low mobility layer for recombination. For example, the excess charge could tunnel into the second region for recombination.

The first and second regions may also be located in the same layer, but at different interfaces of that layer. The different interfaces could have different mobilities, hence, the first region could be located towards the high mobility interface and the second region could be located towards the low mobility interface. For example, the different interfaces could be the first grown (or lower) interface and the second grown (or upper) interface. The charge could move from one interface to the other as required.

Forming the first and second regions in different layers or at different interfaces of the same layer allows a device to be fabricated where the second region is grown at a lower temperature and/or with impurities in order to enhance the non-radiative recombination rate.

For the avoidance of doubt and as used hereinafter, a source where the carriers of the first conductivity type can be switched between different interfaces or different layers will be referred to as a source where the carriers of the first conductivity type can be switched between different channels.

To operate the device, Ohmic contacts are provided to the first, second and third (if present) in order to complete a circuit within the source and prevent charge accumulation.

The quantizing means will preferably provide a one dimensional or quasi one dimensional restriction for the carriers coming from the first region. Normally, this will be provided by a quantum point contact or a split gate. The quantizing means will have an opening. Preferably, this opening is configured to optimise quantization of electron transport This can be achieved if the opening of the quantizing means which is provided towards the leading edge of the SAW will be smoothly varying. For example, the opening may be rounded A study of the design of such quantizing means is discussed in Talyanksii et al, Phys. Rev. B, 56, 15180, 1997-II.

The quantizing means may also comprise a plurality of quasi one dimensional restrictions located across the path of the SAW. In this case, there will be a plurality of channels carrying excess carriers for recombination.

As has been previously mentioned, the SAW provides a wave in the conduction band over the n-p junction. In order that the SAW carries the electrons over the n-p junction, it is preferable if the transition from the n to the p-type region is smoothly varying in energy, so that electrons continue to be confined by the SAW potential.

This may be achieved by providing an insulating region between the first and second regions. The insulating region may be an undoped semiconductor. Alternatively, the insulating region may be induced by providing a gate which is capable of inducing an insulating region between the first and second regions.

Typically, the length of the insulating region in the direction of propagation of the SAW will be 1 mm or less.

It is also possible to smooth the transition in energy from the first to the second region by applying a potential to the first and second regions such that the first region is biased with respect to the second region. Thus, the height of the potential barrier between the first and second regions can be lowered. (It should be noted that if the height of the potential barrier is lowered too much then electrons could flow from the first region to the second region without the SAW. Obviously, this should be avoided). To reduce the height of the barrier, it is preferable if the source is provided with Ohmic contacts to the first and second regions, such that the first and second regions can be biased with respect to one another. These Ohmic contacts may or may not be the same as the Ohmic contacts used to complete the circuit.

In order for the device to work, a SAW must be created Piezoelectric materials will result in a wave of electrostatic potential accompanying the propagation of a SAW. Any structure which does not have inversion symmetry will demonstrate piezoelectric properties in at least one crystallographic direction. Most III–V materials and II–VI materials are piezoelectric. For example, GaAs, InAs, AlAs, GaSb or alloys thereof for example AlGaAs, InGaAs etc.

As piezoelectric properties are usually orientation dependent, it is necessary to orient the SAW transducer such that the SAW propagates in a direction where the material exhibits piezoelectric properties. Preferably, the SAW transducer is oriented such that the SAW propagate in a direction where the material exhibits the optimum piezoelectric properties.

The SAW will generally be produced using a SAW transducer which comprises a plurality of interdigitated contacts wherein each finger of the transducer is separated by a half SAW wavelength. The fingers will produce a SAW propagating in a direction perpendicular to the length of the fingers.

The SAW serves to spatially separate electrons and holes. In order for recombination to occur, electrons and holes must not be spatially separated by the SAW potential in the second region. A moderate hole density in the second region should suffice to completely screen the SAW potential. If the SAW potential is screened then electrons will be released allowing recombination between electrons and holes. To ensure that the SAW potential is screened in the second region, it is preferable if a surface gate is provided overlying the second region.

The present invention requires the presence of excess electrons and excess holes which are laterally arranged such that a SAW can carry electrons into the region with excess holes. There are many ways of providing the excess carriers.

The first and second regions will generally be formed in an active region. The active region may be a plurality of layers or a single layer, for example a layer capable of supporting a two dimensional carrier gas. The excess carriers may be provided in this active region by a doped layer which is provided either adjacent or closely spaced to the active region. For example, the doped barrier layer could be a modulation doped barrier layer comprising an undoped spacer layer provided between the active region and the doped barrier layer. The doped barrier layer may be provided above or below the active region. Alternatively, or in addition to a barrier layer, the carriers may be induced by a gate provided above or below the active region having the carriers, i.e. a front or back-gate.

For the avoidance of doubt as used hereinafter, the term "barrier" layer will refer to a layer with a larger band gap than that of at least one of the layers in the active region. More preferably the barrier layer will have a larger band gap than all of the layers in the active region. A reference to a first layer overlaying a second layer, means that the first layer is situated on an opposing side of the second layer to a base region. The first and second layers do not have to be in contact. A base region can be a semiconductor substrate, a semiconductor substrate and overlaying layers or any layer on which the source is formed.

The source preferably has first and second carrier providing means to induce or supply carriers into the first and second regions. For example, either or both of the first and second carrier providing means can be a gate, a doped barrier layer, or a combination of the two.

Where gates are provided, the gate which is used to induce carriers on the first region will be referred to as a first gate and the gate for the second region will be referred to as a second gate. Either or both of the first and second gates can be a front gate. Similarly, either or both of the first or second gates can be back gates.

The SAW will generally travel on the surface of the source. Therefore, there needs to be a relatively smooth (on the SAW wavelength scale) transition of the source structure along the surface of the source. Conventionally, the source will be formed such that the surface along which the SAW propagates is substantially perpendicular to the growth direction of the device. Thus, the first and second regions of the device are often laterally arranged with respect to the growth direction. Current fabrication techniques generally involve the layer by layer growth of a structure, hence, it is easy to produce a device with variations in its layers in the growth direction. However, producing a variation in the layers perpendicular to the growth directions, i.e. a lateral variation, is less straightforward.

In a second aspect, the present invention provides a method of forming a photon source, the method comprising the steps of:

a) growing an active region overlying a semiconductor base, the active layer having a first conductivity region and a second conductivity region, the first conductivity region having an excess of carriers of a first conductivity type and the second conductivity region having an excess of carriers of a second conductivity type, the first and second regions being laterally arranged with respect to the growth direction;

b) forming wave generating means for providing a surface acoustic wave (SAW) which propagates in a direction such that it travels from the first region into the second region;

c) forming quantizing means between the first and second regions to quantize the carrier transport caused by the SAW.

The active region may be a single layer such as a quantum well layer or a plurality of layers. The semiconductor base may be a semiconductor substrate or it may be plurality of layers which may or may not comprise a semiconductor substrate.

It has been previously mentioned that the carriers to the active region may be supplied by a doped barrier layer. Therefore, the method preferably further comprises the step of forming a doped barrier layer either above or below the active region. The same barrier layer does not have to supply the carriers of both the first and second conductivity type However, preferably the step of forming the barrier layer comprises the step of forming the barrier layer with a variation in its doping in a direction lateral to that of the growth direction.

Fabricating such a device with a lateral variation in the doping of a barrier layer will generally require the use of special fabrication techniques. Many fabrication techniques can be used such as regrowth and ion beam techniques (for example ion beam implantation techniques and ion beam damage techniques).

The device can be fabricated by a regrowth technique by etching the semiconductor base to form two growth planes, for example, a facet could be exposed located between upper and lower parallel planes. If the substrate plane is (100), the structure could be etched to form two 100 planes which are separated by say an (n11)A plane, where n would typically be 4 or less. Any planes which are approximately (n11)A with a suitable n may also amphoterically dope p-type.

If such a structure is formed in GaAs using a silicon dopant, (silicon is an amphoteric dopant), the silicon will n-dope any overgrown doped layers on the (100) planes but will p-dope the doped layers found on the (n11)A planes. A person skilled in the art could easily determine the appropriate growth conditions. Typically, growth at about 590° C. to 630° C. with a low $As_4$ pressure will produce the correct doping. Therefore, it is possible to obtain a structure comprising a P-N junction. The substrate could also be a (n11)A plane and a (100) ridge could be etched onto the substrate such that the ridge or facet dopes n-type whereas the planes parallel to the substrate surface dope p-type.

Thus, it is possible to produce a barrier layer with a lateral variation in its doping such that both holes and electrons can be induced in the quantum well layer. The barrier layer can be formed either above or below the quantum well layer.

Alternatively, the variation in the doping of the barrier layer could be achieved by implanting the barrier layer with p and n type dopants during growth to produce the required doping variation. The n and or p type dopants could be implanted using focused ion molecular beam epitaxy (FIMBE).

The excess carriers in the first region and the second region can be induced by first and second gates respectively. These gates may both be supplied on the semiconductor base side of the active region (i.e. below the active region) or they may be supplied on the opposing side of the active region to the semiconductor base i.e. above the active region. Alternatively, one gate may be supplied above the active region and the other may be supplied below the active region.

The first and second gates may also be provided in the same layer as it is also possible to produce a back or a front-gate with a lateral variation in its doping. Therefore, the device preferably comprises a highly doped gate layer which is doped with an amphoteric dopant, the layer being formed on at least two planes, wherein at least one of the planes causes n-type doping and the other plane causes p-type doping. Highly doped means that the transport characteristics of the layer are generally metallic.

To produce this type of structure, the method of fabricating the device comprises the steps of etching the semiconductor base to form at least two different growth planes and growing a heavily doped gate layer which is doped with an amphoteric dopant overlying the at least two growth planes.

The gates are used to induce carriers of the appropriate conductivity type in the first and second regions. The gates can be used either instead of or in addition to a barrier layer which has a lateral variation in its doping. The gates can be of the same conductivity type or opposing conductivity types. It is also possible to use gates of the same conductivity type where the barrier layer does not have a variation in its doping across the first and second regions. A single gate could also be used and the source could be biased with respect to this single gate such that carriers of opposing conductivity types are provided to the first and second regions respectively.

The above devices have been formed overlying a facet where the facet has been etched through a single material and just serves to vary the orientation of the growth plane to allow for amphoteric doping. However, further advantageous variations on the device are possible if the facet intersects two or more layers. Varying the composition of the layers which the facet intersects allows the confinement potential of carriers on the facet to be modified.

Further, one or more of the layers intersected by the facet may be a gate layer i.e. a heavily doped semiconductor layer. This gate may be formed at either end of the facet i.e. close to the junction of the facet with the upper or lower plane. The gate can be biased to deplete out carriers to form an insulating region between the first region and second region.

Also, a gate may be provided towards the centre of the facet in order to induce carriers of the second conductivity type on the actual facet. Either of the "facet gate" layers could be a p-type layer or an n-type layer regardless of the conductivity type of the second conductivity type.

As there is no real need to provide a doped barrier layer with a lateral variation in its doping, providing that gates or some other means are provided to induce excess carriers of different conductivity types in the first and second regions, it is also possible to use a re-growth technique to fabricate the structure which does not require the use of amphoteric dopants or require an etched semiconductor base.

A substrate or a substrate with buffer layer(s) is overgrown with a heavily doped layer. The n-type layer is then etched to form an island The etch is preferably a selectively plane etch which produces smooth (on the scale of SAW wavelength λ) side walls at the edges of the island. A heavily doped p-type layer is then overgrown over the substrate/buffer layer and n-type island. This p-type layer is then etched to form a p-type island which is spatially separated from the n-type island. The p and n-type islands can be used as back gates for the structure. The active layer and barrier layers can then be overgrown over the p and n-type gates. Of course, it will be appreciated that either the n-type gate or the p-type gate could be formed first It should also be noted that it is not necessary for the gate which is used to induce the holes and the gate which is used to induce the electrons to be of opposing conductivity types. It is possible to induce holes using an n-type gate and it is also possible to induce electrons using a p-type gate. Therefore, a doped p or n-type semiconductor layer can be growth over a planar substrate or buffer layer to form the back gate. This doped layer can then be etched to form two isolated islands which will be the two back gates. These islands are preferably formed with sloping side walls to allow for smooth overgrowth of the remaining layers.

Also, as previously mentioned, the first and second gates could be formed on opposing sides of the active region. Either the first or the second gate could be formed by any of the above techniques and a surface gate could be used for the remaining gate.

It is also possible to use FIMBE to form a gate layer which is embedded into the structure which has both p-type and n-type laterally arranged gates. The gates produced could be a p-type and an n-type gate. Alternatively, the technique could be used to dope two spatially separated regions with the same conductivity type (i.e. either both n-type or p-type). It is also possible just to dope a single region to form a single back-gate.

It is also possible to use a technique which relies on ion beam damage. It has been found that if a thin layer of heavily doped semiconductor (for example a layer less than 200 nm) is implanted with high energy ions, then these ions destroy the conductivity of the layer. Therefore, it is possible to pattern a layer into conducting and non conducting sections. This can be used to fabricate one or two spatially separated islands to form one or two back-gates as required.

The above techniques can be used in isolation or in combination with each other. For example, both ion beam fabrication methods and amphoteric doping techniques can be used to fabricate a single device.

It should also be noted that a front gate could be used on either or both of the first or second conductivity regions. However, it may be less desirable to put a front gate on the first conductivity region as this could cause screening of the SAW.

It is also desirable to be able to collect the light emitted from the second region with minimum loss. Therefore, it is preferable if the structure is provided with a wave guide layer. Such a wave guide layer is preferably provided over or under at least part of the second semiconductor region. For example, the second region could be embedded in a waveguide structure. Another way of achieving directed photon emission (i.e. photons preferentially emitted in a small solid angle) is to use a microcavity structure. Therefore, it is also preferable if the second region has either a reflecting layer above the active layer, or a reflecting layer below, or both.

Typically, SAW wavelengths are between 0.25 $\mu$m to 10 $\mu$m, but will usually be about 1 $\mu$m or less for this device.

In a third aspect, the present invention provides a method of generating photons, the method comprising the steps of creating a surface acoustic wave (SAW) which travels from a first region having an excess of carriers with a first conductivity type to a second region having excess carriers with a second conductivity type, the first and second conductivity types being opposing conductivity types, such that excess carriers from the first region are carried by the wave to the second region; and quantizing the carrier transport caused by the wave, such that the number of carriers introduced into the second region can be controlled to the accuracy of a single carrier.

DESCRIPTION OF THE DRAWINGS

The present invention will now be described with reference to the following preferred non-limiting embodiments in which.

DESCRIPTION OF THE PREFERRED EMBODIMENTS

Figure 1:
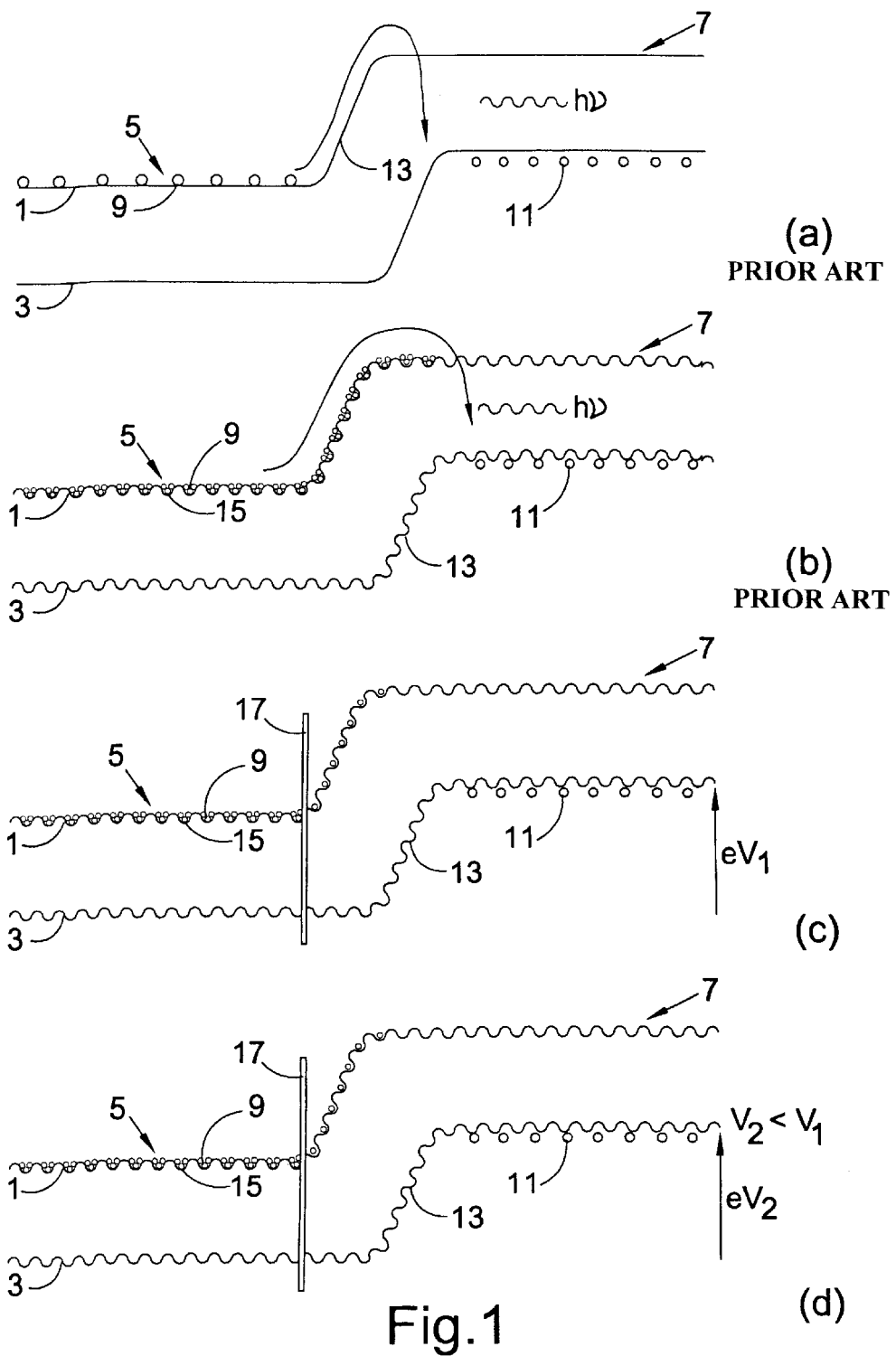
FIGS. 1A to 1D show schematic band structure of a P-N junction which can form part of a device in accordance with the first embodiment of the present invention.

FIG. 1A shows a schematic view of a P-N junction. The conduction band 1 is the upper band and the valence band 3 is lower in energy than the conduction band 1. The device has an n-region 5 and a p-region 7. The n-region has excess electrons 9 and the p-region has excess holes 11.

It is well known that a P-N junction such as the one shown in FIG. 1A can be used as the basis of a light emitting device. The junction can be biased such that electrons 9 from the n-region 5 are given enough energy to overcome the potential barrier 13 and to be excited into the conduction band of the p-region 7. The excited electrons then recombine with excess holes 11 in the p-region. The radiative combination of an electron and a hole causes the emission of a photon. This is the principle of operation behind a standard photo-diode. However, it is not possible using such a structure to control the emission of light to the accuracy of a single photon, as many millions of electrons will be excited across the junction and will combine with many millions of holes.

FIG. 1B shows a similar band structure to that of FIG. 1A. However, here, the P-N junction has been subjected to a surface acoustic wave (SAW). A surface acoustic wave propagating on a piezo electric material is accompanied by a travelling wave of electrostatic potential which has the effect of modulating both the conduction 1 and valence 3 bands. It should be noted that FIG. 1B is a schematic drawing, to show the perturbation of the conduction and valence bands caused by the SAW.

If the SAW is sufficiently powerful and the change in energy from n to p is sufficiently slowly varying, the SAW can be used to carry these electrons over the P-N junction barrier 13 into the conduction band 1 of the p-type region 7 where they can recombine with excess holes 11. This device again can be used to emit light in the same way as the device of FIG. 1. However, again, it is not really possible to control the device such that a single electron and bole can recombine. Although, the control over the number of electrons introduced into the p-type region is better in this device than that shown in the device of FIG. 1A, it is still not possible to control the device such that individual photons can be emitted.

FIG. 1C shows a modification on the device of FIG. 1B. This device can be controlled such that a single electron and hole can recombine one at a time, to emit a single photon. The injection of electrons 9 into the p-type region 7 can be controlled to the accuracy of a single carrier. In other words, the injection can be controlled such that 1, 2, 3, 4 etc electrons can be introduced into the p-type region 7 as required.

The device of FIG. 1C is similar to that of FIG. 1B, except, here, the electron transport induced by the SAW is quantized prior to the electrons being introduced into the second region The quantization can be achieved by a split gate, quantum point contact or some other quantization means. The description hereinafter will refer to a split gate or quantum point contact. However, it will be appreciated that any other type of quantizing means 17 could be used.

The quantum point contact can limit the number of electrons in each potential minimum 15 to the accuracy of a single carrier. For example, the number of electrons in each minima can be 1, 2, 3 etc as required. The quantum point contact has two gates (not shown), and transport through the quantum point contact is controlled by applying a bias to these gates.

The quantum point contact could be biased such that more than one electron could be located in each of the minima 15. However, for the purposes of this example, it will be assumed that each minimum after passing through the quantum point contact 17 carries a single electron. The single electrons are carried over barrier 13 into the p-type region 7. Thus, the SAW can be used to inject electrons one by one, one per cycle of the SAW field, into the p-type region 7 and hence photons can be emitted one by one, correlated with the SAW driving field, into the p-type region 7.

The conduction and valence band edges of the n-type region 5 and the p-type region 7 are not aligned in energy. To smooth the transition between the n-type region 5 and the p-type region 7, a transition region may be provided. The transition region may be an insulator.

It should also be noted that the first 5 and second 7 regions can be biased with respect to each other. FIG. 1D shows a schematic band structure of biased device. In the unbiased device (of FIG. 1C), the height of the barrier, i.e. the energy difference between the conduction bands of the first and second regions is $eV_1$. If a positive voltage is applied to the second region 7, the height of the potential barrier can be lowered. FIG. 1D shows a biased junction where the barrier height has been reduced to $eV_2$. Here, $eV_2 < eV_1$. The bias should be small enough to prevent the flow of electrons over the barrier in the absence of the SAW.

FIG. 1 is a schematic diagram to explain the principle underlying the operation of the device. Therefore, no information should be derived from this figure concerning the wavelength of the SAW or the height of the perturbation caused by the SAW, or the screening of the SAW by holes in p-region, or any screening which might be caused by a gate overlying the p-type region 5.

Figure 2:
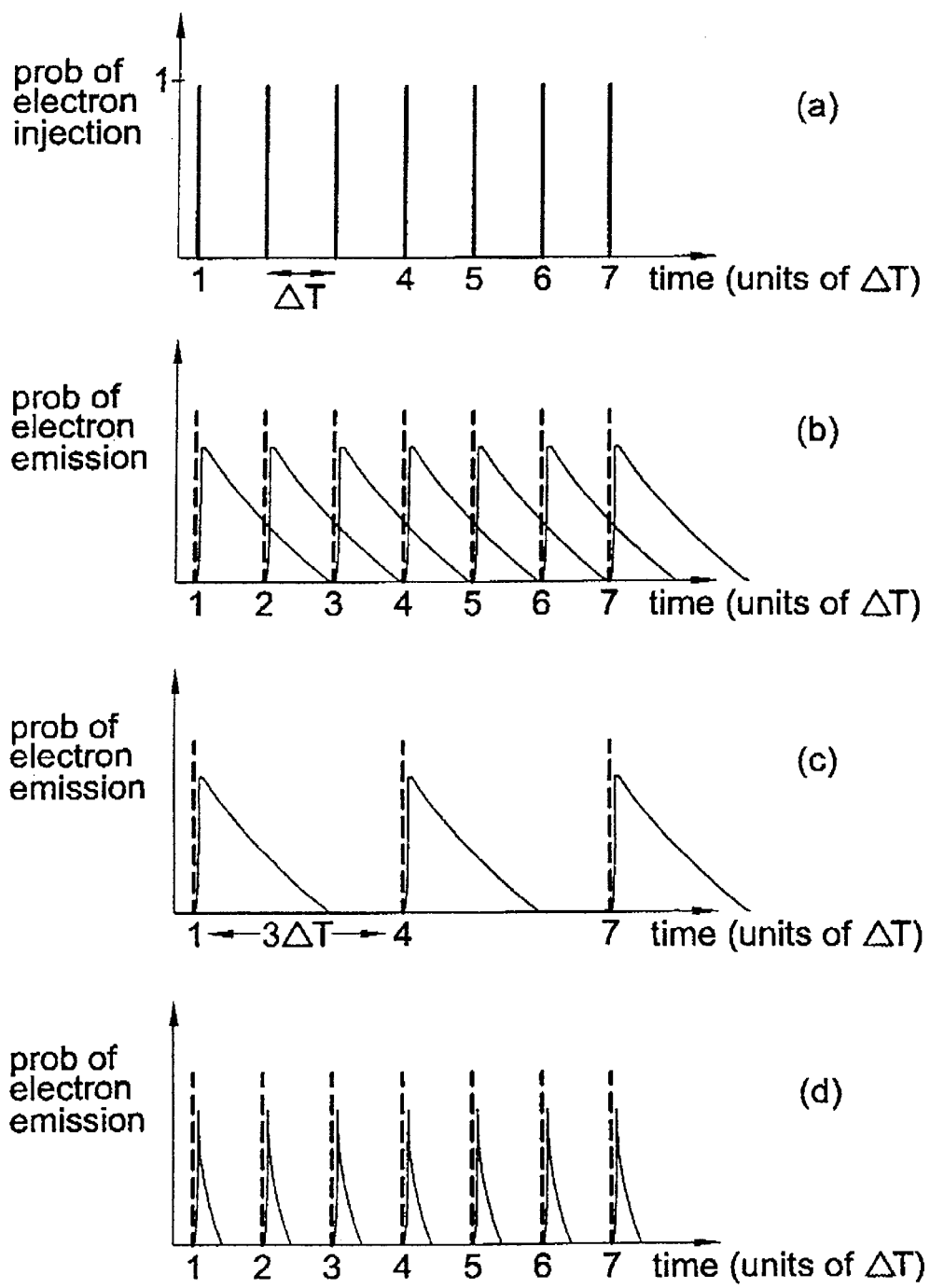
FIGS. 2(a)–2(d) show schematic plots of carrier injection into second region against time and photon emission against time.

The present invention can be used to produce a train of single photons or n-photon pulses. FIG. 2 shows design considerations for an ideal single photon source. However, it will be appreciated that the principles can easily be extended to an n-photon source.

In an ideal single photon source, a beam of photons is emitted where the time interval between the photon emission events is constant Thus, there needs to be a strong correlation between the event in the source which triggers the emission of a photon and the photon emission event itself. In the ideal single photon source, there is no noise in the produced signal and there is no uncertainty in the time of photon emission. The photon states produced by an ideal source are called photon number states, or Fock states. The name "single photon source" implies an ideal single photon source, i.e. a source which produces the Fock state |1> on demand. A close approximation to an ideal single photon source can be obtained by ensuring that the uncertainty in the time between successive creation events is much less than the average time between successive photon emission events.

FIG. 2A shows a schematic plot of probability of electron injection into the second region against time. Single electrons are carried by the SAW into the second region in a regular stream. Each of the spikes shown in FIG. 2A correspond to a single electron being injected into the p-type region. The time between successive injection events is $\Delta T$. The electron injection events have been drawn as perfect $\delta$-functions. However, in reality, there will be a small uncertainty in the electron emission events which will cause a broadening of the $\delta$-function. In practice, this uncertainty will be negligible compared to the uncertainty in the resulting photon emission event.

Each of the electrons needs to recombine with a hole to emit a photon. The photon emission events are not a regular series of spikes. Instead, they are broadened by an uncertainty $\delta t$. The dotted lines in FIG. 2B represent individual electron injection events. The probability of successive photon emission events overlap such that it is impossible to determine which electron injection event gave rise to a particular photon. To avoid this happening, the uncertainty $\delta t$ in the photon emission events should be much smaller than the time difference $\Delta T$ between electron injection events. There are two main ways which this optimum condition can be enhanced.

FIG. 2C shows a plurality of photon emission events with the same uncertainty $\delta t$ as that of the emission events in FIG. 2B. However, here, these emission events are caused by electrons which are injected with a larger spacing in time than that of FIG. 2A. Here, the separation between successive electron injection events is $3\Delta T$. It is difficult to increase the SAW period ($\Delta T$ for a given source. However, it is possible to suppress the electrons in the SAW cycles such that only one electron every 2, 3, 4 etc cycles is injected into the second region. In FIG. 2C, only every third electron is introduced into the second region. However, in general, it will often be desirable to suppress the electron injection into the second region such that only one electron in every 100 or so cycles of the SAW field is introduced into the second region. It should be noted that if the electrons are injected into the second region every m cycles, then the time separation between successive injection events will be m times SAW period with any uncertainty in the time of the injection event due to an uncertainty in the exact spatial position of the electron in the SAW minima. This uncertainty is small compared with the SAW period and the recombination time.

In addition to, or instead of increasing the successive time between electron injection events, the uncertainty $\delta t$ can also be reduced. The uncertainty $\delta t$ in the time of the photon emission events is predominantly due to the finite value of the total recombination time. The total recombination rate includes both the radiative recombination rate (where an electron and hole combine to emit a photon) and the non-radiative recombination rate, (where an electron and hole recombine without the emission of a photon). If the non-radiative recombination time is much smaller than the radiative recombination time, the non-radiative recombination rate will dictate the total recombination rate.

Methods for decreasing the uncertainty in photon emission time can involve putting an upper limit on the total recombination time. For example, the width of the p-type region can be limited so that the electron either combines or is removed from the p-type region within a short space of time.

As mentioned above, the uncertainty can also be reduced by increasing the radiative recombination rate of the electrons with holes, or increasing the non-radiative recombination rate. This is illustrated by FIG. 2D which schematically plots the probability in photon emission against time.

Device configurations for suppressing certain electron injection events into the second region and for increasing the radiative recombination rate or increasing the non-radiative recombination rate will be discussed later in this description.

Figure 3A:
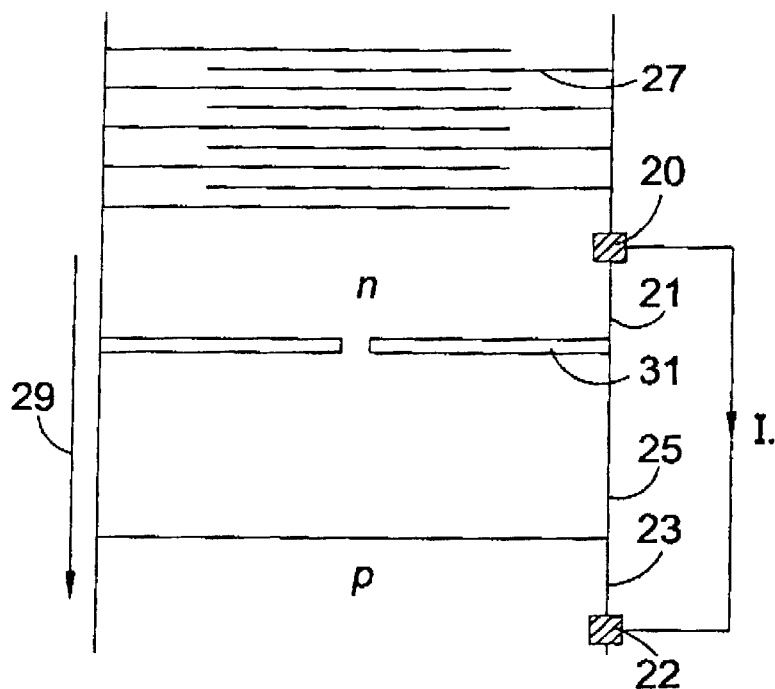
FIGS. 3A and 3B show a plan view of a device in accordance with a first embodiment of the present invention.

FIG. 3A shows a plan view of the device in accordance with an embodiment of the present invention. The device has a n-type region 21 separated from a p-type region 23 by an insulating region 25. The n-type region 21 has electrons as excess carriers and the p-type region 23 has holes as excess carriers.

Ohmic contacts 20 and 22 are provided to n region 21 and p region 23 respectively. The Ohmic contacts 20 and 22 are connected to complete the unit. Also, the ohmic contacts prevent charge accumulation in the source.

The device is provided with a transducer 27 located on the opposite side of the n-type region 21 to the p-type region 23. The transducer comprises a plurality of interdigitated contacts to which an ac bias is applied to create a SAW which can flow across the surface of the device. The location of the transducer 27 means that the SAW travels from the transducer 27, across the n-type region 21 and into the p-type region 23.

A surface acoustic wave created by the transducer 27 is capable of modulating the conduction and valence bands as shown in FIGS. 1B and 1C. Arrow 29 shows the direction of the SAW generated by transducer 27. The accompanying electrostatic wave flows through n-type region 21 where it induces an acoustoelectric current. At the end of region 21 there is a quantum point contact (QPC) 31. The size of the QPC 31 is chosen such that the conductance through the channel is one dimensional or quasi one dimensional transport in the absence of the SAW. In the presence of the SAW, the QPC 31 is biased beyond conductance pinch off, i.e. there is no current through the channel in the absence of the SAW. Application of a sufficiently powerful SAW results in a current through the channel 31. The SAW wavelength and channel geometry ensure that the electrons are confined to move in packets through the channel 31, and the SAW potential and the electron-electron interaction ensures that the number of electrons per packet is integer and a constant.

The SAW then flows into the insulator region 25. The insulator region 25 is provided to ensure that the transition from n-region 21 to p-region 23 is smoothly varying in energy, i.e. that the conduction band edge varies smoothly between the p and n-regions. If the transition in energy is too rapid, the SAW may not carry electrons from the n-type region 21 into the p-type region 23 as shown in FIGS. 1B and 1C. Other methods could be employed to smooth the transition from the n-type region 21 to the p-type region 23, for example applying a bias as shown in FIG. 1D.

The SAW injects the electrons into the p-type region 23 at a constant rate, one per cycle of the SAW field. The electrons are injected into the p-type region, one by one, where they can recombine with a hole. To operate the device as a single photon source, the rate at which photons are emitted or, equivalently, the frequency with which the radiative recombination occurs, needs to be maintained as constant as possible and there must be no uncertainty as to which electron gives rise to which photon. If the device is operated to produce a stream of single photons one electron needs to combine with one hole at a time, and within the conditions described in relation to FIG. 2.

Figure 3B:
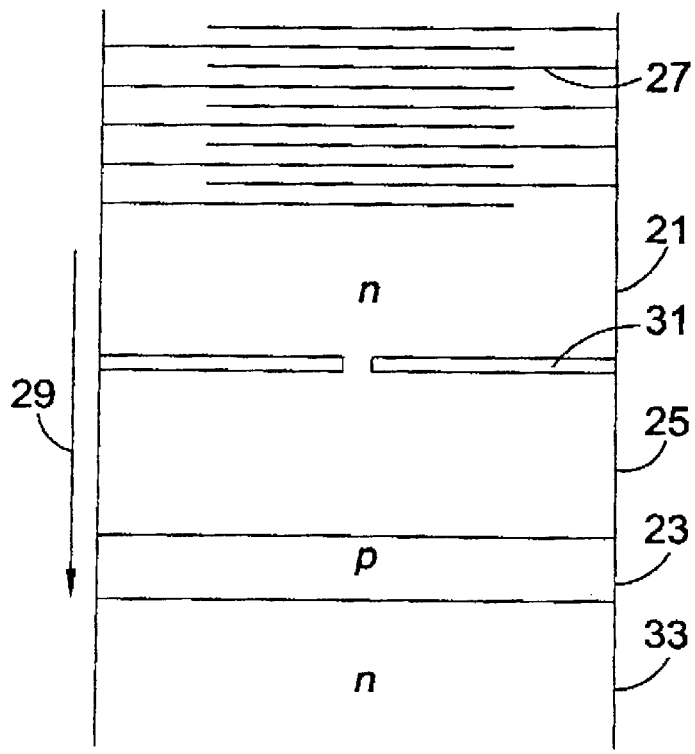

FIG. 3B shows a variation on the device of FIG. 3A. The device has a n-type region 21 separated from a p-type region 23 by an insulating region 25. The n-type region 21 has electrons as excess carriers and the p-type region 23 has holes as excess carriers. The device has a further n-region 33 on the other side of the p-region 23.

To ensure that only one electron combines with one hole at a time, an n-type region 33 is provided on the opposing side of the p-type region to the SAW transducer 27. The width of the p-type region 23 in the direction of SAW transport, is chosen to be such that only the electrons delivered by one cycle of the SAW will be present in the p-region 23 at any one time. Ideally, the electrons are only within the p-region a time which is much less than ΔT. Therefore, only one electron is in the p-type region 23 at any one time. If the electron does not recombine with a hole, or recombine by other means, during this passage through the p-type region 23, it is swept into n-type region 33. There are no excess holes in this region. Therefore, the electrons cannot recombine to emit photons.

In the above device, there can be missing emission events both as a result of non-radiative recombination and as a result of the probability of recombination in the second region being much less than 1.

Figure 4A:
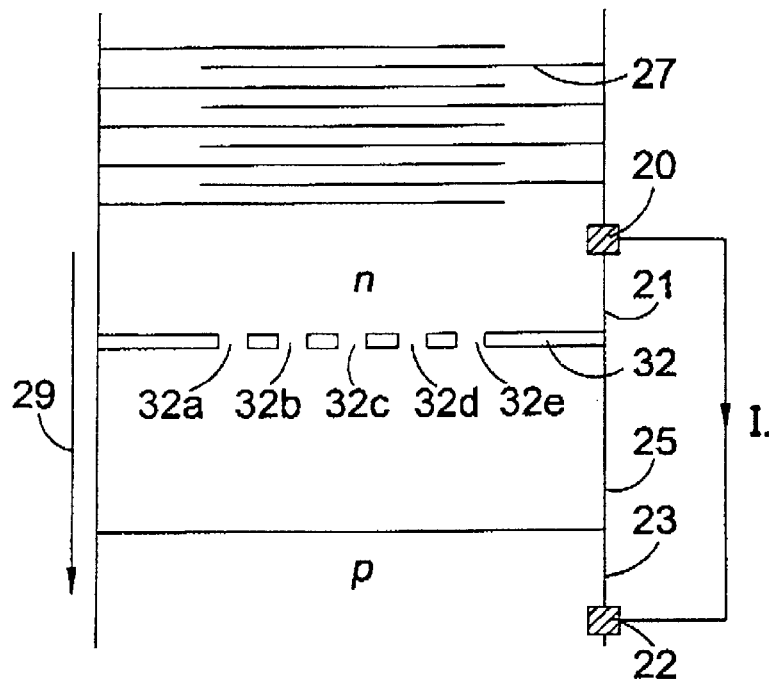
FIGS. 4A and 4B shows a multi-channel device which is a variation on the device of FIGS. 3A and 3B.

FIG. 4A is similar to FIG. 3A. To avoid unnecessary repetition, the same reference numerals have been used as FIG. 3A However, here, instead of a single split gate 31, a split gate with a plurality of openings 32 is provided as the quantizing means. Five channels 32A to 32E are created by multiple split gate 32. The split gate 32 can be biased such that each of the channels 32A to 32E transmits a single electron. Therefore, five individual trains of single electrons are injected into p-region 23. In the same way as described in relation to FIG. 3A, the multiple split gate 32 can be configured such that each of the channels transmits more than one electron per SAW cycle, or the individual arms of gate 32 can be biased such that each of the channels 32A to 32E transmit differing amounts of electrons, for example, channel 32C could transmit one electron, channel 32B and 32D could transmit two, and channel 32A and 32E could be biased so that they transmit no electrons.

Figure 4B:
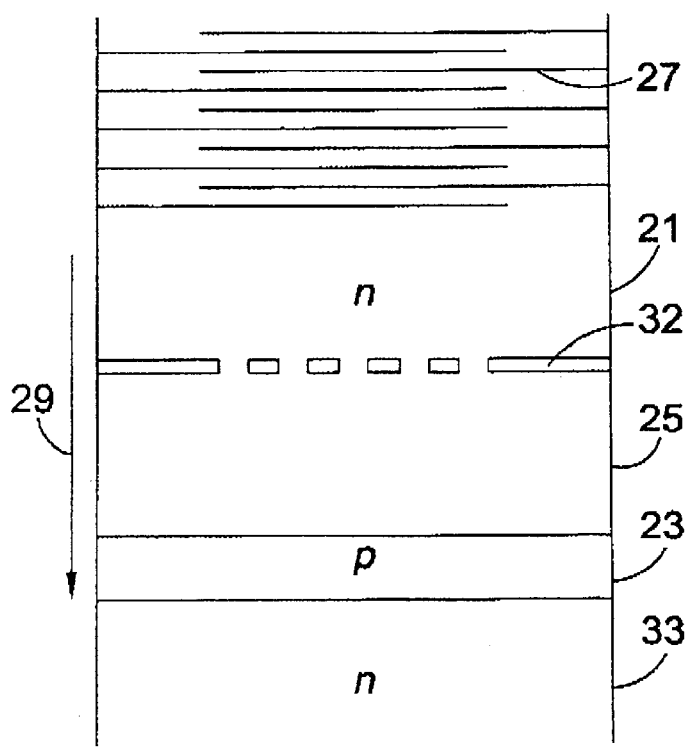

FIG. 4B is a variation on the design of FIG. 3B. However, here, a multiple split gate 32 is provided as described in relation to FIG. 4A. The functioning of split gate 32 is identical to that described in relation to FIG. 4A.

Figure 5:
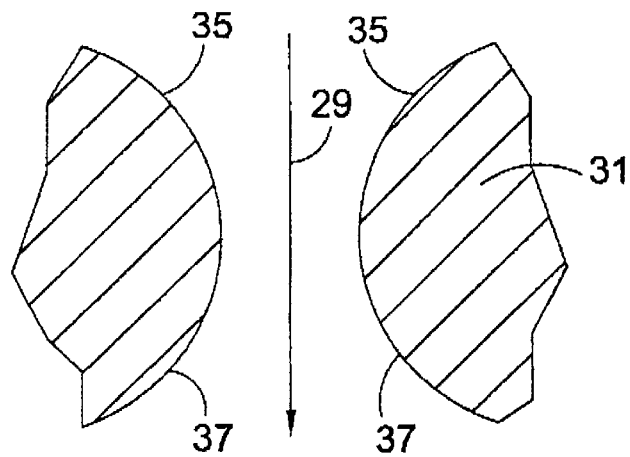
FIG. 5 shows a preferred quantum point contact configuration for use with any embodiment of the present invention.

FIG. 5 shows a quantum point contact suitable for use with the source. The quantum point contact 31 has a smoothly varying entrance 35 and exit 37. The SAW enters the split gate 31 at entrance 35. This rounded shape has been found to produce more accurate quantization.

Figure 6:
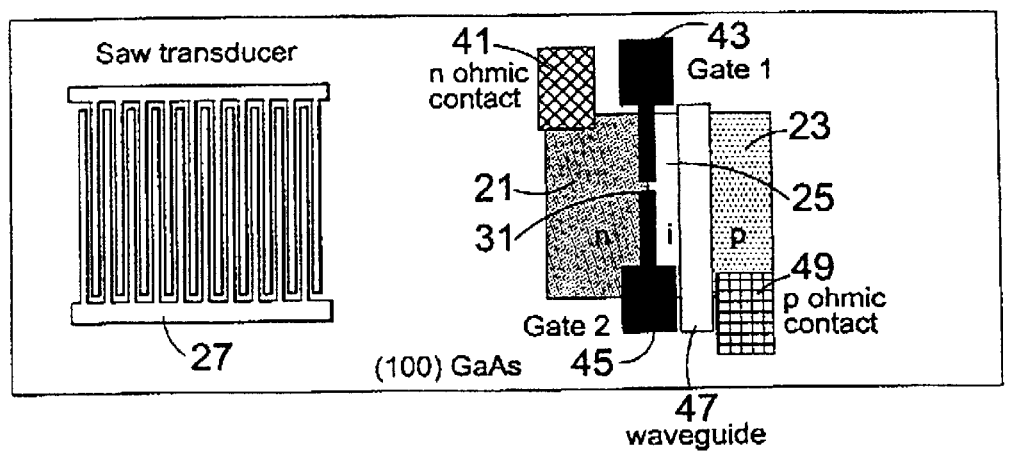
FIG. 6 shows a plan view of a device in accordance with an embodiment of the present invention.

FIG. 6 shows a plan view of a device in accordance with an embodiment of the present invention. Contacts have been made to the device. To avoid unnecessary repetition, like features which have been described with reference to FIG. 3 have been given the same reference numerals.

As in FIG. 3, the SAW transducer produces a SAW which travels towards n-type region 21. N-type region 21 is contacted by Ohmic contact 41. The layer structure of the n and p regions will be described with reference to FIG. 7. N-type region 21 supports a two dimensional carrier gas in which the excess electrons are held. The travelling electrostatic wave which accompanies the SAW induces an acoustoelectric current in the two dimensional carrier gas. An n-type Ohmic contact 41 is made to the electrons in the carrier gas such that a bias can be applied relative to the two dimensional carrier gas to vary the carrier density in the n-type region 21 . This could be the same contact as the one provided to complete the circuit, or an additional contact.

Split-gate 31 is provided between the n-type region 21 and insulating region 25. The gate has two arms. Preferably, separate contacts 43 and 45 are made to each of these arms such that an independent bias can be applied to each arm This is useful because the position of the conduction channel defined by the two arms can be moved relative to the two arms. For example, it may be necessary to move the position of the channel to avoid a defect in the channel. Also, if there is a problem with one of the arms and it requires a higher potential to define the channel than the other gate arm, then this can also be accommodated for in the split gate 31 where the arms can be independently controlled.

The SAW passes through insulating region 25 into p-type region 23. A wave guide 47 is formed over at least a part of the p-type region. The wave guide results in a larger proportion of the emitted photons being emitted in a small solid angle to make more available for detection. The waveguide 47 should ideally cover the part of the p-region 23 where recombination primarily occurs i.e. the recombination region Where the length of the p-type region 23 is limited as described with reference to FIGS. 3B and 4B, the whole of the p-type region 23 will be the recombination region, and hence, the waveguide 47 should ideally extend over the whole p-type region 23. If the p-type region 23 is longer (in the direction of the SAW) than the recombination region, the waveguide 47 will preferably only extend over a part of the p-type region 23.

A p-type Ohmic contact 49 is made to the p-type region 23. Although it cannot be seen in this plan view, the excess carriers in the p-region are held in a two dimensional hole gas which is supported by the p-type region 23. A p-type contact 49 is made to this two dimensional hole gas. It is provided so that a bias can be applied relative to the carriers within the two dimensional hole gas. Also, the ability to bias both the p-type region 23 and n-type region 21 with respect to a common ground allows the n-type region 21 and the p-type region 23 to be biased relative to each other.

Figure 7A:
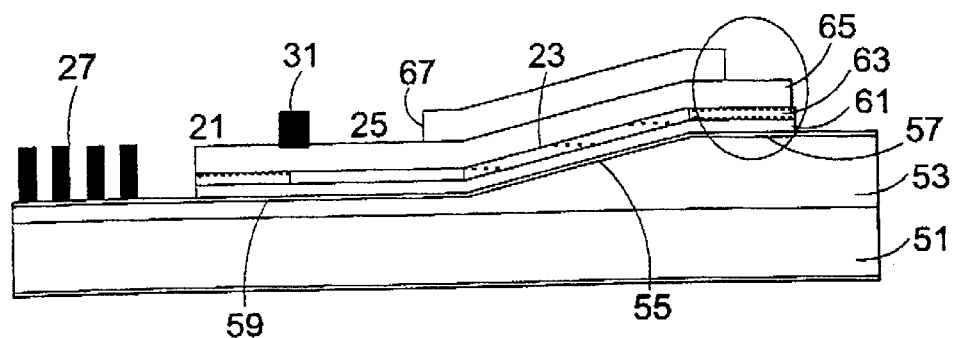
FIG. 7 shows a cross section of an embodiment of the present invention fabricated using amphoteric doping.

FIG. 7A shows a cross sectional view of an embodiment of the present invention. Again, as with FIG. 6, the same reference numerals will be used where possible. The device is formed on a 100 substrate 51. An undoped buffer layer 53 is then formed on an upper surface of the substrate 51. Buffer layer 53 is provided to form a good processing surface for the following processing steps. The undoped buffer layer 53 is then etched to expose a (311) A facet 55. (Other (n11)A facets could be chosen). This facet 55 is formed between upper (100) level 57 and lower (100) level 59.

A first barrier layer 61 is then formed overlying the upper and lower planes 57 and 59 and the facet 55. First barrier layer 61 is present to provide a good growth surface to the subsequent layers. The first barrier layer also prevent impurities from the etched interface from migrating through the active layers of the device during growth. A quantum well layer which is capable of supporting a two dimensional carrier gas is then formed overlying first barrier layer 61.

An amphoterically doped barrier layer 65 is then formed overlying quantum well layer 63. An amphoteric dopant is a dopant which can dope the same layer both p-type and n-type depending on the growth conditions of the layer and the crystallographic orientation of the layer. The amphoterically doped barrier layer is configured such that on addition of a single type of dopant, n-type doping occurs on the upper and lower 100 planes 57, 59 and p-type doping occurs on the facet 55. The facet is the (311)A facet. This will dope p-type for Si doping at a growth temperature of between 590° C. and 630° C. and a low $As_4$ pressure. However, (n11)A facets where n<5 have been found to dope p-type using a Silicon dopant in AlGaAs.

Overlying the doped barrier layer 65 a wave-guide layer is formed. The wave-guide 67 is configured such that it can channel light away from the structure. In the particular configuration shown, light is emitted parallel to the facet 55 and out of the page. Waveguide layers may also be introduced under the quantum well layer 63. Alternatively, the p-type region could be embedded in waveguide layers.

To process the structure, a mesa is formed by etching through the layers which are formed on the etched barrier layer 53. In other words, the wave-guide layer 67, the doped barrier layer 65, the quantum well layer 63 and the buffer layer 61 are etched to define the active area of the device. The wave-guide layer 67 is then further etched so that it covers some or all of the p-type layer and possibly part of the P-N junction. However, it is removed from the actual n-type region 21. It is also removed from any other n-type regions which are after the recombination region. Alternatively, the waveguide could be made to overlie the n-type region 21, if the waveguide 67 is made thin enough not to dampen the SAW.

The SAW transducer is then fabricated on top of buffer layer 53. The SAW transducer 27 is fabricated by defining an interdigitated contact pattern using standard photolithographic techniques or standard electron beam lithography techniques and evaporating a suitable gate metal such as Au or NiCr or Al etc onto the defined pattern and using a standard lift-off technique.

The split gate 31 is then formed by an electron beam patterning technique. Here, the gate metal is evaporated onto a layer of electron beam resist which has been patterned using an electron beam. However, it is also possible to define a 1D construction using a shallow-etching technique or deep etching.

Figure 7B:
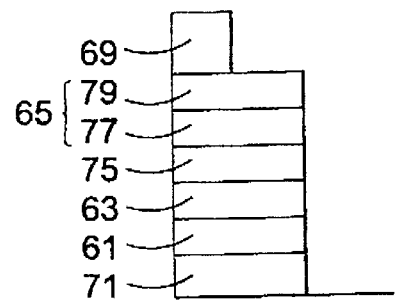

An example of the layers which can be used to fabricate the device of FIG. 7A is shown in FIG. 7B. For clarity, the same reference numerals will be used. A GaAs substrate is used (not shown) and an undoped GaAs buffer layer 53 is formed on the substrate. This is then etched as shown and described with reference to FIG. 5A to form two (100) planes connected by a (311A) facet The structure is then grown with a second GaAs buffer layer 71. An AlGaAs or GaAs/AlAs superlattice 61 is then formed on an upper surface of the GaAs buffer layer. This primarily functions to prevent impurities from the etched surface from diffusing through the structure during growth. A GaAs quantum well 63 is then formed overlying the superlattice 61. A doped barrier 65 is formed overlying the quantum well layer 63. This doped barrier layer 65 is a modulation doped barrier layer which comprises an undoped AlGaAs buffer layer 75 provided adjacent the quantum well layer 63 and a AlGaAs silicon doped barrier layer 77 provided overlying the undoped buffer layer 75. An undoped GaAs cap layer 78 is then formed overlying the doped barrier layer 75. A waveguide layer 67 is then formed overlying the GaAs cap layer 79. The wave-guide layer in this structure is a $Al_{0.7}Ga_{0.3}As/$GaAs superlattice. The doped barrier layer 77 could also be provided underneath the quantum well layer 63.

Figure 8:
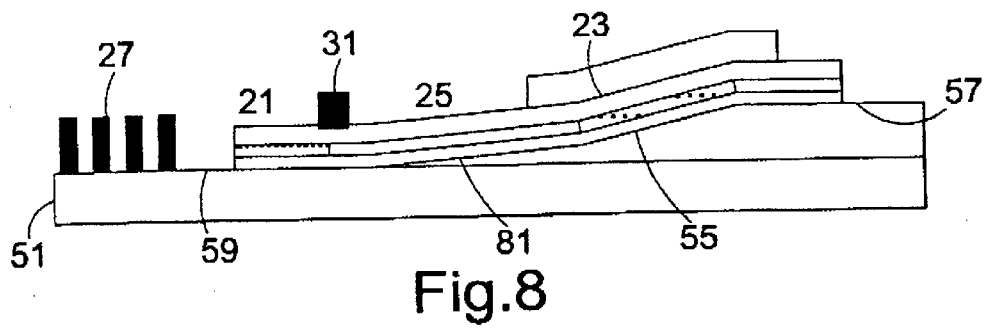
FIG. 8 shows a variation on the device of FIG. 7.

FIG. 8 shows a variation on the structure of FIG. 7. Where appropriate, the same reference numerals have been used as in FIG. 7A. The main difference between FIGS. 7 and 8 is that in FIG. 8, a compensated doping region 81 is provided between the n-type region 21 and the p-type region 23. This compensated doping region 81 is an insulating region and is provided by forming a 411A facet in addition to the 311A facet when etching layer 53. The compensated region 81 allows for a smoother transition from the n-type region 21 to the p-type region 23. The layers 61 to 67 are then overgrown in exactly the same manner as described with reference to FIGS. 7A and 7B.

The compensation region 81 does not have to be a defined facet, it could be provided by a smoothly varying profile from the (311A) faced to the (100) plane. In the devices shown in FIGS. 7 and 8, the SAW transducer is located on the lower plane and the SAW propagates up the facet. The inverse device could also be fabricated in the same way, where the SAW transducer is situated on the upper plane and the SAW propagates down the facet. The layers overlaying the etched layer 55 can be grown such that the compensation region 81 is formed either at the top or bottom of the facet.

Figure 9:
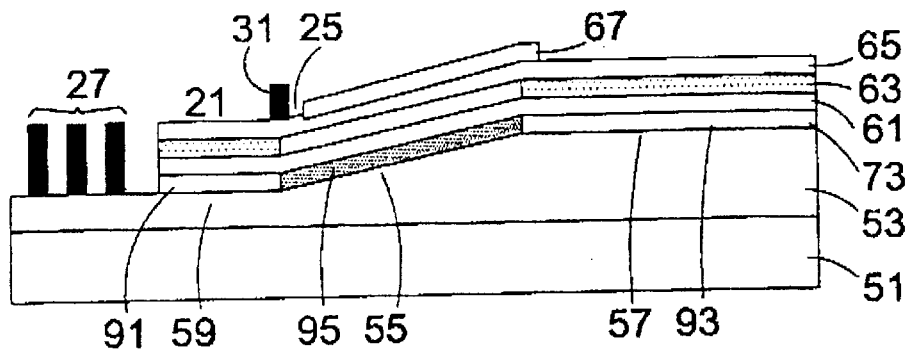
FIG. 9 shows a variation on the device of FIG. 7.

FIG. 9 shows a further variation on the structure of FIGS. 7 and 8. The same reference numerals have been used where possible. The device of FIG. 9 has an extra layer 73 to that of device shown in FIG. 7A. Layer 73 is provided between the first buffer layer 53 and the first barrier layer 61. The layer 73 which will be termed "the gate layer" is grown onto the etched buffer layer 53. The gate layer 73 is a heavily doped (e.g. about $1 \times 10^{18}$ cm$^{-3}$) layer such that its properties are almost metallic in behaviour. The gate layer 73 is also amphoterically doped so that it is heavily n-type doped on upper and lower planes 57 and 59 and heavily p-type doped on facet 55. Thus, the single gate layer 73 forms n-type gates 91 and 93 and p-type gate 95. The r-type gates can be used to induce electrons in quantum well layer 63 on the upper and lower planes 57 and 59. The p-type gate 95 can be used to induce a two dimensional hole gas in layer 63 above facet 55. This variation in the excess carriers of layer 63 can be achieved without the need for amphoteric dopants in the doped barrier layer 65. However, an amphoterically doped gate layer 73 can be used in addition to an amphoterically doped barrier layer 65.

Figure 10:
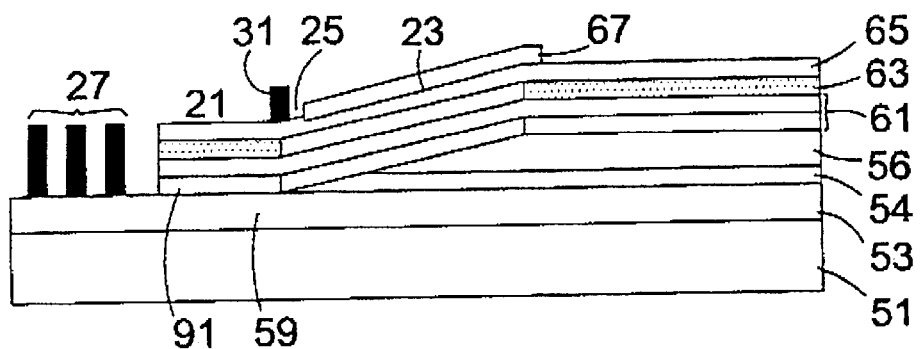
FIG. 10 shows a variation on the device of FIG. 7.

FIG. 10 shows a further variation on the structure of FIG. 7. Again, the same reference numerals will be used where possible. In this device, the initial growth layer prior to the etched formed facet 55 differs from those described in relation to FIGS. 7 to 9. The subsequently grown layers can be any of those described with reference to FIGS. 7 to 9. A first buffer layer 53 is formed overlaying substrate 51. A heavily doped n or p-type layer 54 is then formed overlaying first buffer layer 53. A second buffer layer 56 is then formed overlaying side gate layer 54. The second buffer layer 56 and the gate layer 54 are then etched to expose facet 55. Sometimes, the etch will proceed into first buffer layer 53. However, it is important that the etch fully removes gate layer 54.

Layers 61 to 65 (which may optionally include layer 73) are then overgrown as described with reference to FIG. 7A. The gate layer 54 is thus located at the lower junction between the facet 55 and the lower 100 plane 59, in other words, between the first and second regions 21 and 23. The gate layer 54 can be used to deplete out p-type carriers in layer 63 to form an insulating region between the first region 21 and the second region 23.

Figure 11:
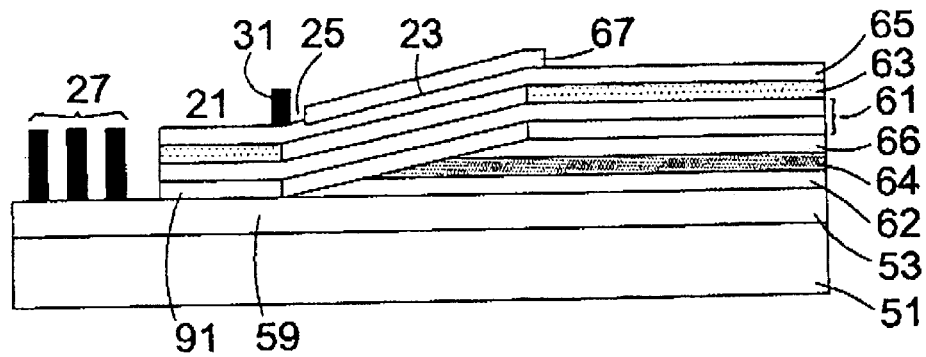
FIG. 11 shows a further variation on the device of FIG. 7.

FIG. 11 shows a further variation on the devices of FIGS. 7 to 10. The same reference numerals have been used where appropriate. As for FIG. 10, the main difference lies in the layers formed before the etch to expose facet 55. The overgrown layers 61 to 65 can be any of those described previously with reference to FIGS. 5 to 7. First buffer layer 63 is formed overlaying substrate 51. First substrate buffer layer 62 is formed overlying first buffer layer 63 Substrate gate layer 64 is formed overlying first substrate barrier layer 62 and upper substrate barrier layer 66 is formed overlying substrate gate layer 64. The structure is etched through layers 66, 64 and 62 to expose facet 55. Layers 61 to 65 are then overgrown with barrier layer 61, quantum well layer 63, and upper barrier layer 65 as described with reference to any of FIGS. 7A to 9.

Facet gate 64 is positioned so that it is in the centre of the facet 55. Substrate gate 64 can therefore be used to induce holes in region 23. This avoids the need to provide amphoteric doping in layer 65.

In the type of structures shown in FIGS. 10 and 11, the facet is formed through a number of different types of layers. By varying these types of layers, the confining potential of the second region 23 can be finely tuned by varying the layer structure which lies adjacent the facet (for example, in FIG. 11, layers 62, 64 and 66). Of course, a plurality of layers or a superlattice could be provided in this region if required.

The basic operation of the device has been and will continue to be described with electrons being carried by the SAW as opposed to holes. However, it will be appreciated by those skilled in the art that the device could be a p-n junction as opposed to n-p and holes could be carried by the SAW to combine with electrons.

Figure 12:
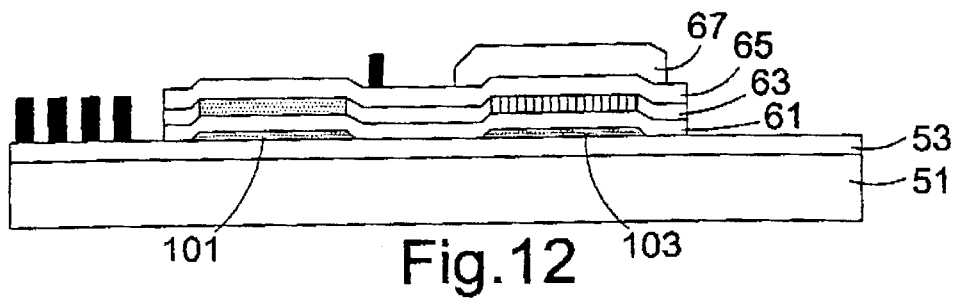
FIG. 12 shows a further embodiment of the present invention fabricated using a re-growth technique.

FIG. 12 shows a further embodiment of the present invention. Again, where appropriate, the same reference numerals will be used as for FIGS. 7 to 11. FIG. 12 differs from FIGS. 7 to 11 in that instead of a doped barrier layer 77 or 65 provided to supply the n or p-type carriers to the quantum well layer 63, a back-gate 101 is provided to supply electrons to the quantum well layer 63 and a back gate 103 is provided to induce holes in the quantum well layer 63.

In the same manner as described with reference to FIGS. 7 to 11, an undoped buffer layer 53 is formed on an upper surface of an undoped substrate 51. Back gates 103 and 101 can be formed of the same materials. This layer is a highly doped semiconductor layer. For example, doping will be of the order of $10^{18}$ cm$^{-3}$. The layer is then etched to form two spatially separated islands 101 and 103 which form the two back gates. The etch is chosen such that the sides of the spatially separated islands 101, 103 have sloping sides. This allows the smooth overgrowth of the remaining layers. The layers 61 to 67 are then overgrown and processed as described with reference to FIGS. 7 to 11. However, barrier layer 65 does not have to be doped. A positive bias supplied to n-back gate 101 will induce electrons directly above the n-back gate. A negative bias to back gate 103 will produce holes directly above the back gate 103 and the quantum well layer 63.

Figure 13:
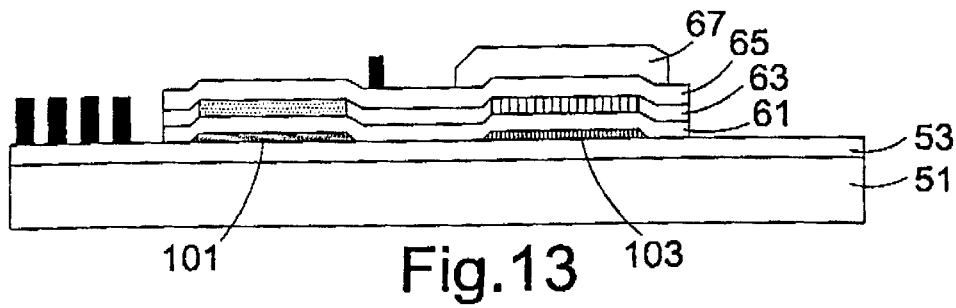
FIG. 13 shows a variation on the structure of FIG. 12.

Alternatively, layers 101 and 103 may be of different conductivity types. This variation is shown in FIG. 13. This will require two growth stages to form both of the back gates. Layer 101 will be formed and etched into an island, then layer 103 will be formed and etched to form island 103. The remaining layers are overgrown as previously described.

Figure 14:
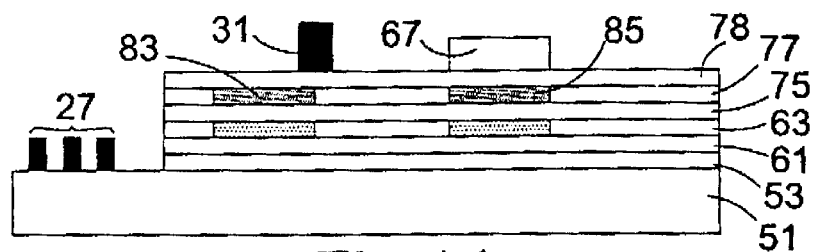
FIG. 14 shows a further embodiment of the present invention fabricated using an ion beam technique to dope a barrier layer.

FIG. 14 shows a further embodiment of the present invention. Here, the variation in the lateral doping to form the lateral P-N junction is provided by a technique which is known as Focused Ion Molecular Beam Epitaxy (FIMBE). In the same manner as described with reference to FIG. 7A, an undoped buffer layer 53 is formed overlying substrate 51. An undoped barrier layer 61 is then formed overlying the undoped buffer layer 53. A quantum well layer 63 is then formed overlying the undoped barrier layer 61. A further undoped barrier layer 75 which forms part of a modulation doped barrier layer 73 is formed overlying the quantum well layer 63 and a doped barrier layer 77 is provided overlying the undoped barrier layer 75. FIMBE allows the structure of a layer to be changed not only in the direction of growth but a lateral variation in the layer composition during the growth of the layer. Therefore, as doped barrier layer 77 is formed, a first region of this layer 83 is n-type doped and a spatially separated second region 85 is p-type doped. Therefore, electrons will be induced in the area 86 of the quantum well layer 63 which lies directly below the n doped region 83 of the doped barrier layer 77. Similarly, a two dimensional hole gas will be formed in the region 87 which is formed directly below p-doped region 85 of doped barrier layer 77. An upper cap layer 78 is formed overlying the doped barrier layer 77.

Wave-guide region 67 is then formed overlying cap layer 78.

The device is then processed in the same manner as that described for FIG. 7A. The wave-guide layer 67, the quantum well layer 63 and barrier layer 61, 75 and 77 are etched to divide the active region of the device 91. The wave-guide 67 is then etched so that it does not cover the n-type region 21. Transducer 27 is formed on the surface of undoped buffer layer 53 in the same manner as described with reference to FIG. 7A. Split-gate 31 is then formed in an identical manner as described with reference to FIG. 5A.

Figure 15:
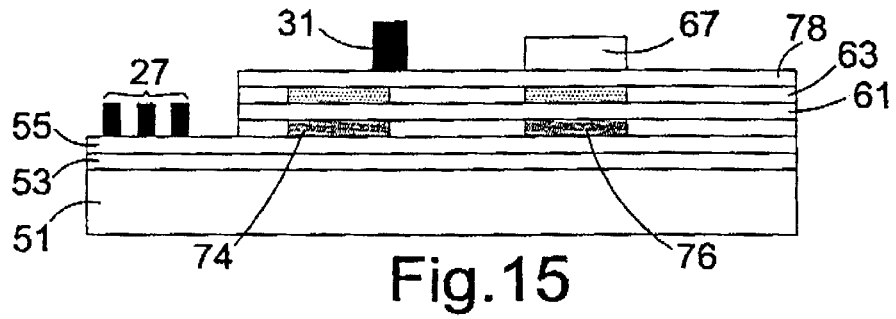
FIG. 15 shows a further embodiment of the present invention using an ion beam technique to dope the gate layer.

FIG. 15 shows a variation on the device of FIG. 14. Here, back-gates are formed using the FIMBE technique described above. To fabricate the structure, the buffer layer 53 is formed overlying a substrate 51. A gate layer 73 is then formed overlying the buffer layer 53. The gate layer 55 is implanted using FIMBE to form two spatially separated regions 74 and 76 which are highly conductive and have the same conductivity type. These regions 74 and 76 serve as back-gates. Undoped barrier layer 61 and quantum well layer 63 are formed overlying gate layer 55. A cap layer 78 is formed overlying quantum well layer 63. The device is then processed in an identical manner to that described for FIG. 14.

The device could also be fabricated by forming an n$^+$ region overlying layer 53. The n$^+$ layer could then be ion beam damaged in the regions which are not to form back gates to define back gates 74 and 76.

Figure 16:
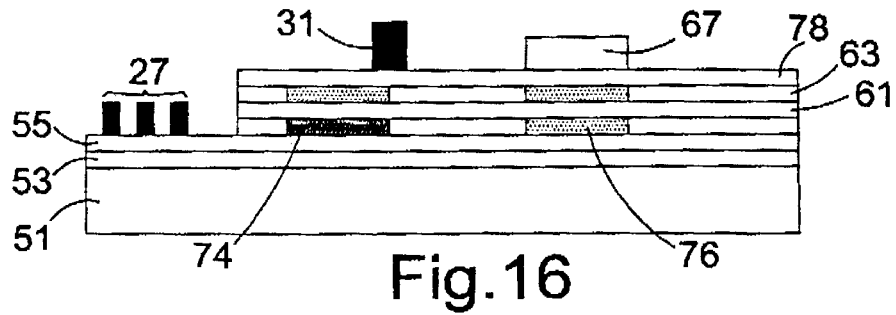
FIG. 16 shows a variation on the structure of FIG. 14 using either an ion beam implantation technique or a ion beam damage technique to form the gates.

FIG. 16 is similar to FIG. 15 except, here, the gate layer 55 is implanted with both p-type and n-type ions to form p-type back-gate 76 and n-type back-gate 74.

Figure 17:
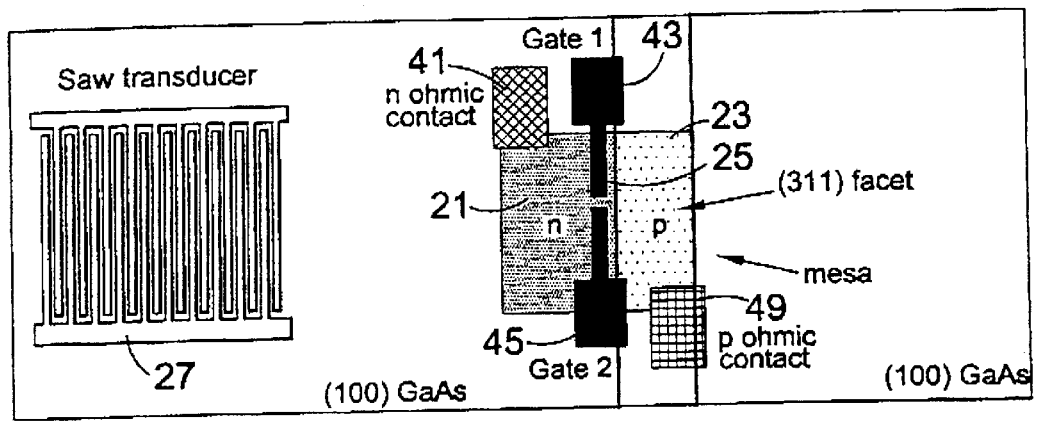
FIG. 17 shows a plan view of the structure of FIG. 7.

FIGS. 17 to 21 are schematic plan views of various examples of the device. In FIG. 17, the device is fabricated using amphoteric dopants as described with reference to FIG. 7. The n-type region and the SAW transducer 27 are formed on 100GaAs. The p-type region 23 is formed on a (311)A plane as described with reference to FIG. 7.

Figure 18:
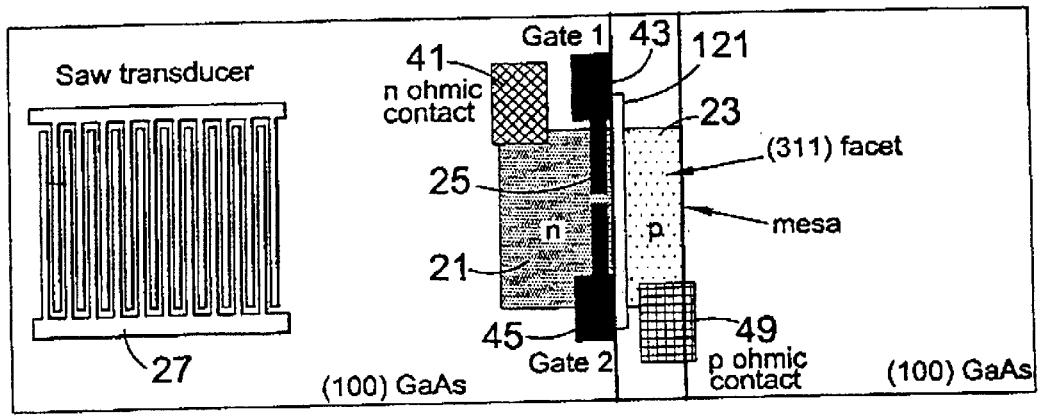
FIG. 18 shows a variation on the structure of FIG. 17.

FIG. 18 shows a variation on the device of FIG. 17. Here, a wave guide region 121 is provided in the recombination region.

Figure 19:
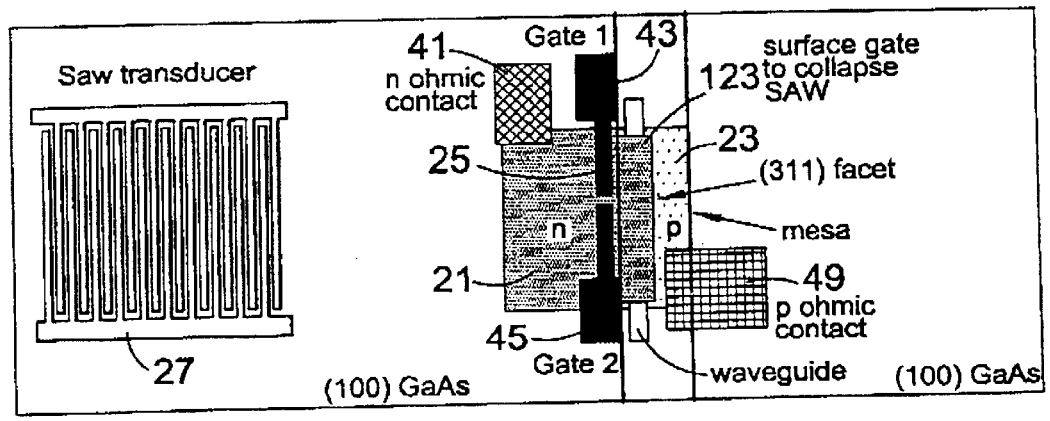
FIG. 19 shows a variation on the structure of FIG. 17.

FIG. 19 shows a further variation on the device of FIG. 18. Here, a surface gate 123 is provided overlaying the wave guide 121. The surface gate serves to collapse the SAW potential to ensure recombination can occur.

Figure 20:
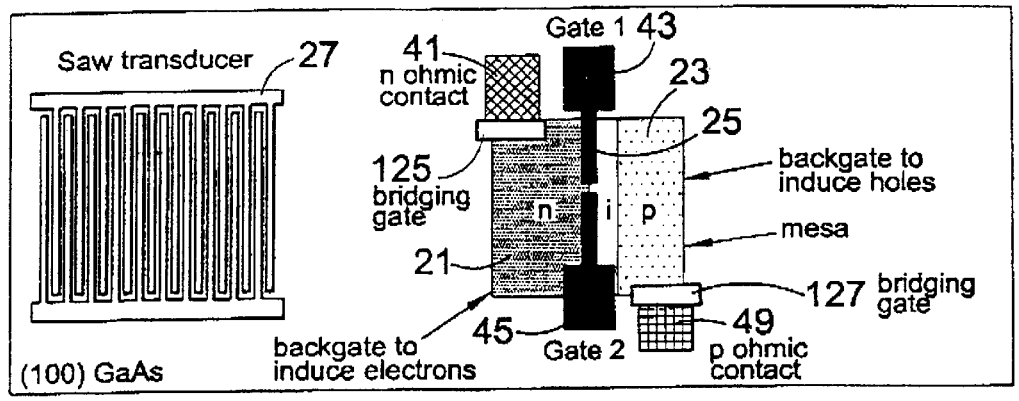
FIG. 20 shows a variation on the structure of FIG. 17.

FIG. 20 shows a further variation on the structure. Here, the structure is formed on a (100)GaAs plane. There is no (311A) facet. The n-region 21 and the p-region 23 are induced by back gates (for example, the type discussed with reference to FIGS. 15 and 16.

Bridging gates 127 are provided at the junction between the contacts 41 and 49 to the first and second regions and the first and second regions 21, 23 respectively. The bridging gates are used to induce carries between the contact and the region to which the contact is connected. The carriers here are induced by either a front or a back-gate. Continuity problems can occur between the edge of the gate and the contact. The bridging gates ensure continuity in this situation.

Figure 21:
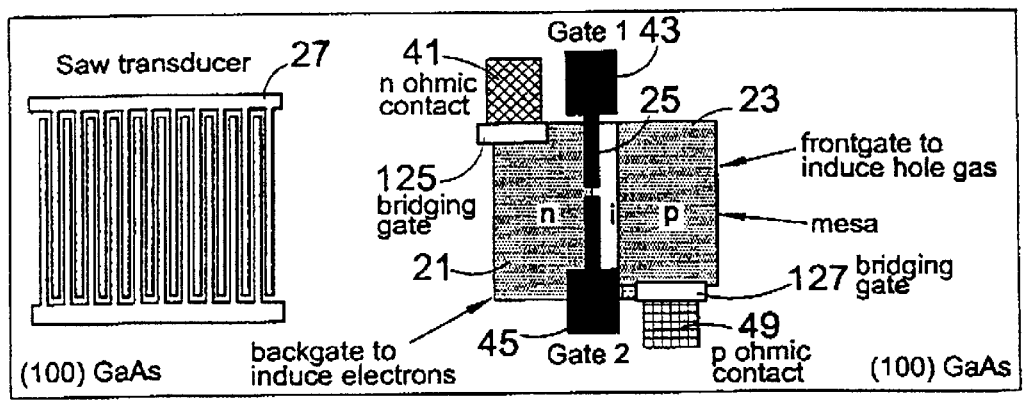
FIG. 21 shows a variation on the structure of FIG. 17.

FIG. 21 shows a further variation on the device of FIG. 20. Here, a front gate 131 is used to induce the holes in the p-region 23. The bridging gates 127 are provided overlying an insulating layer which connects the contact 149 to the front gate 131. Hence, the bridging contact does not short the front gate 133 to the contact 149.

Figure 22:
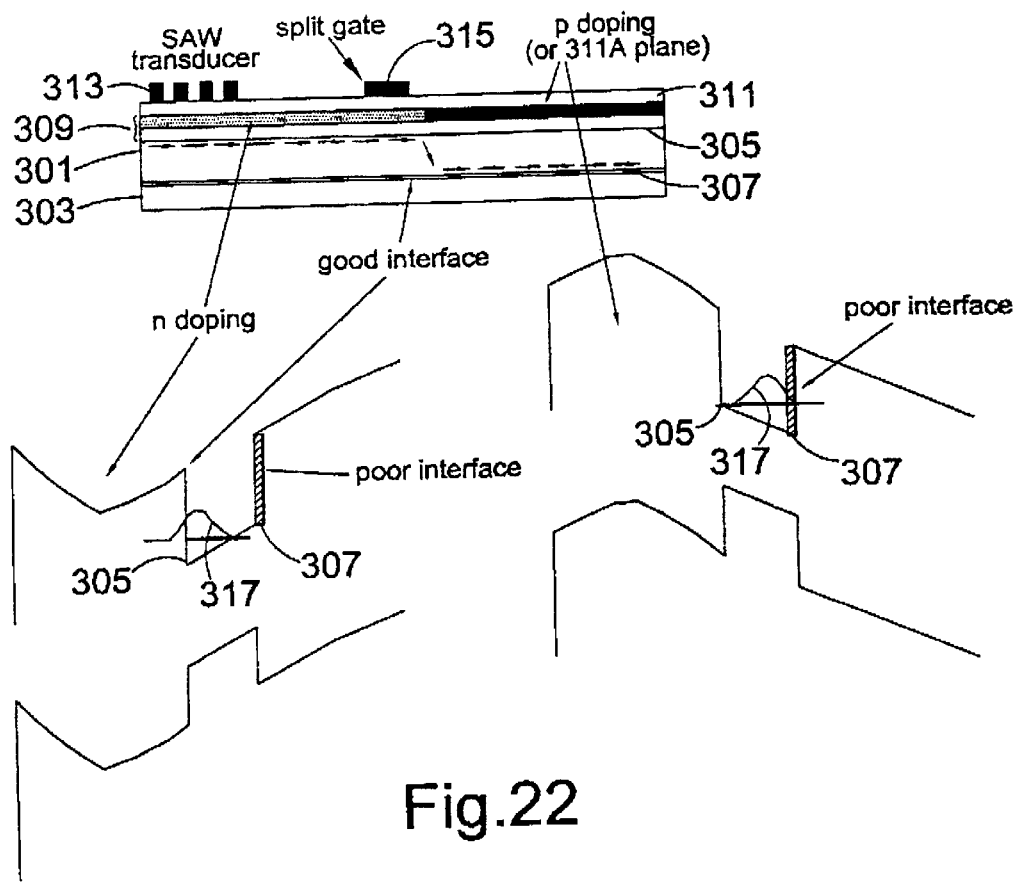
FIG. 22 shows a source according to the present invention configured using two conduction channels.
Figure 23:
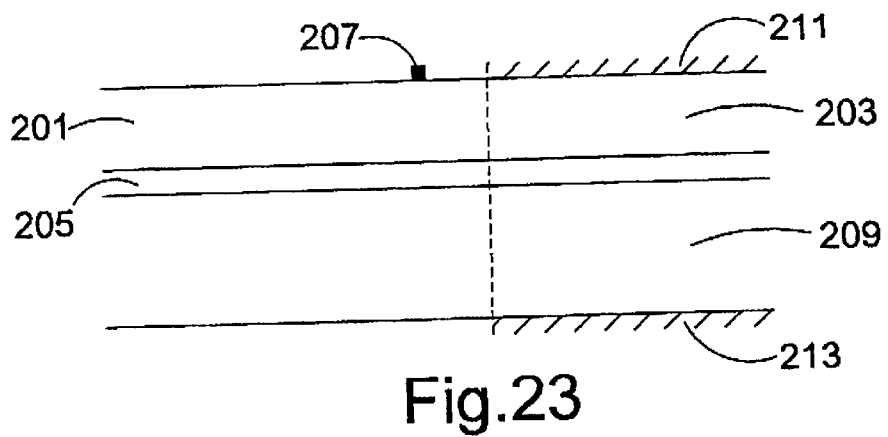
FIG. 23 shows a schematic of a source according to the present invention enclosed within a microcavity.
Figure 24:
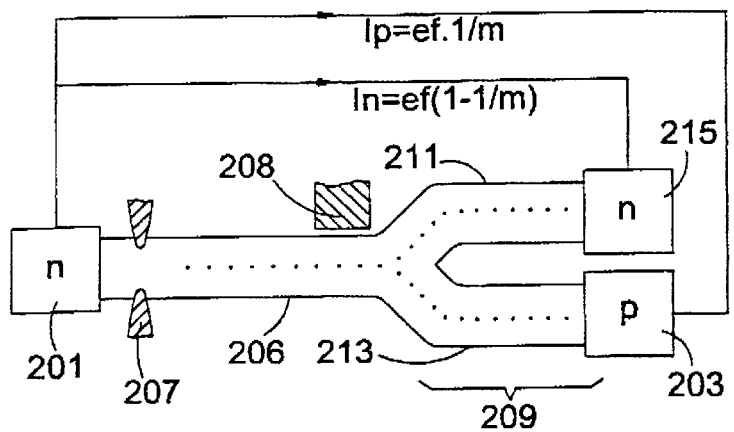
FIG. 24 shows a source according to the present invention with a current Y-splitter following the split gate.

FIGS. 22 to 24 show device configurations which can be used to enhance total recombination of electrons and holes in the second region as described with reference to FIG. 2D. In order to correlate the creation time of a photon or (or n-photon pulse) with the injection time of a single electron (or n electrons), and to reduce the uncertainty in emission time, it is important that there is only the electron (or n electrons) carried by a single injection in the second region at any point in time. It is possible as previously described (FIGS. 3B and 4B) to limit the length of the p-region so that electrons which have not recombined within a time t<<T, where $T^{-1}$ is the electron injection rate, are swept out of the p-region. However, it is also possible to reduce the uncertainty in the emission time if the total recombination rate of the electrons with the holes is increased.

FIGS. 22 and 23 show devices where this can be achieved.

FIG. 22 shows the source configured as, what is commonly called, a velocity modulation transistor.

The transistor is similar to the device structures previously described. Here, for simplicity, the device is shown with flat planar layers. However, it will be appreciated that the device might be formed using one of the regrowth techniques previously described. A wide quantum well layer 301 is formed overlaying a substrate 303. The wide quantum layer has a good interface 305 and a bad interface 307. The bad interface is the interface which is closest to the substrate. This interface is generally worse because it is the first grown. Electrons travelling at this interface will have a much lower mobility than electrons travelling at the good interface 305. A modulation doped barrier layer which has been doped p and n-type 309 is formed overlying the quantum well 301. A capping layer 311, a SAW transducer 313 and a split gate 315 are formed as previously described. The quantum well layer 301 can be grown on top of the substrate at a fairly low temperature at the bad interface (for example, less than 450° C.), the temperature can then be raised to a more typical growth temperature (for example, about 590° C.) at the good interface. Growing a layer at a fairly low temperature results in that layer having enhanced recombination properties. It actually has enhanced non-radiative recombination properties. Therefore, if radiative recombination does not occur quickly, the electron will recombine non-radiatively. Gates will be provided on the structure (not shown) in order to initially pull the electrons towards the good interface 305. The electrons are against this interface as they pass through the region underneath the split gate 315. As the electrons enter the second region, a gate is provided to pull the electrons towards the bad interface 307 where its recombination rate is enhanced.

The two band structures show the electron wave function 317 initially pulled towards the good interface 305 and then pulled towards the bad interface 307 in the second region.

In almost all of these structures, if the quantum well is wide enough, then it may be possible to enhance the recombination rate using gates by moving the electron current from a high mobility side 305 in the first region to a low mobility side of the 2DEG in the second region.

In order to increase the radiative recombination rate, the device could also be configured with a microcavity. FIG. 23 shows a simplified device configuration to illustrate this principle. The first region is n-type 201 and the second region 203 is p-type. The excess carriers are carried by the SAW along channel 205. The doping variation in this channel could be achieved as described for any of the previous devices. For simplicity, the means for achieving the doping variation will not be shown here. Carriers are carried in channel 205 and are quantized by quantizing means 207. The quantized carriers are then carried into the second region 203. Second region 203 is within a microcavity 209. The microcavity has an upper reflecting surface 211 and a lower reflecting surface 213. These reflecting surfaces could be provided by Bragg stacks or metallic regions. The microcavity confined the optical field in the growth direction. Microcavities also result in directed photon emission.

FIG. 24 shows a device configuration which ensures the time interval between injection of electrons is longer than the recombination time via the reduction of the rate at which electrons are injected from the first region 201 (n-type) to the second, or recombination region 203 type). The electrons are emitted as a quantized current from the quantizing means (207) and are injected initially into the transition region 206. The quantized stream of carriers is carried by the SAW to a gated current Y-splitter 209. Thus, the path of the electron in the transition region splits into two branches 211 and 213. Branch 211 directs electrons to an n-type region 215, and branch 213 directs electrons to a p-type region 203. The Y-splitter is gated in synchronism via gate 208 with the driving SAW field such that branch 211, the branch which connects to the n-type region, is open for m−1 SAW periods, and the other branch 213, the one which connects to the p-type region, is open for one period only. Thus for every m electrons (or m pulses of n-electron packets) incident on the current Y-splitter 209, only one electron (or one packet of n electrons) is injected into the p-type region 203 and can recombine. Thus the current injected into the p-type region. 203 is reduced by a factor m from the quantized current produced by the quantizing means 207. Equivalently, the rate of electron injection into the p-type region 203 is reduced by the factor m from the quantized current produced by the quantizing means 207. It should be noted that no information concerning the gate size should be derived from FIG. 24.

Figure 25:
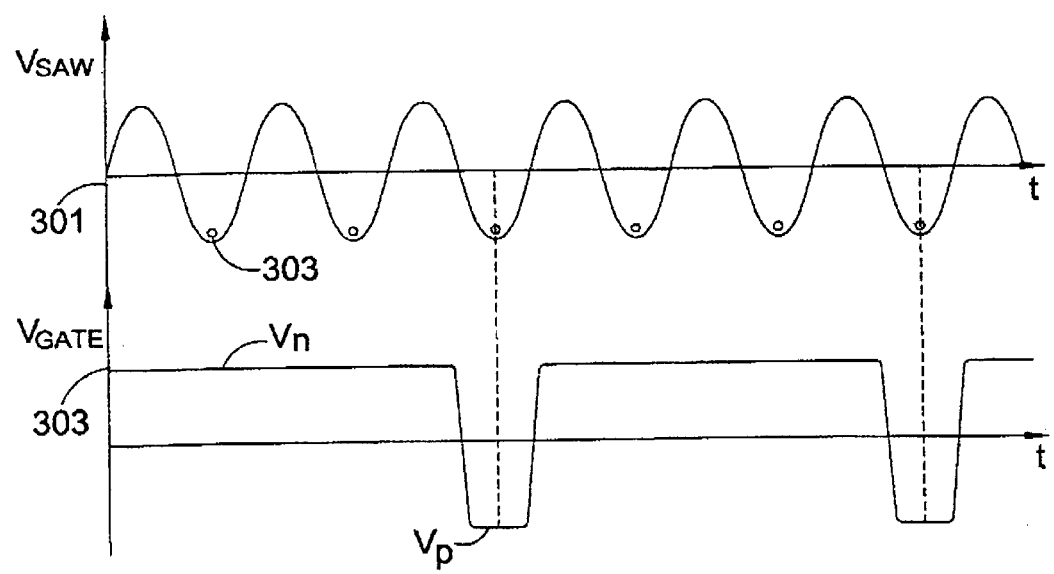
FIG. 25 shows a schematic plot of gate voltage applied to the current Y-splitter.

FIG. 25 is a plot which schematically illustrates the action of the current splitter 209 of FIG. 24. The upper plot 301 is a schematic of the SAW potential against time. A single electron 303 is located in the minima of the SAW. The trace 303 shows the variation in the gate potential on the current Y-splitter 209 (FIG. 24). When potential $V_n$ is applied to the current Y-splitter 209, the electrons can only pass down through branch 211 into n-region 215. When potential $V_\rho$ is applied, the electrons pass down through branch 213 into p-region 203. If the potential on the current Y-splitter 209 is varied such that potential $V_\rho$ is only applied to coincide with the minima of one in every three cycles of the SAW, then only the electrons carried in one of every three SAW minima will reach the recombination region. This allows the time between successive electron injections to be increased as described with reference to FIG. 2C.

In the example shown in FIG. 25, m=3. However, it should be noted that m can be any integer which is greater than one.

The behaviour shown in FIG. 25 could also be achieved by using a single split gate 31 described, for example, with reference to FIGS. 3A and 3B. Using the reference numerals of FIGS. 3A and 3B, the split gate 31 could be pulsed so that no electrons can be transmitted through gate 31, say m−1 cycles of the SAW and is only open for 1 cycle in the SAW in every m. This would also serve to reduce the rate of flow of electrons into the p-region 203 by a factor of m.

What is claimed is:

1. A photon source, comprising:
   a first semiconductor region having excess carriers of a first conductivity type;
   a second semiconductor region having excess carriers of a second conductivity type, the first and second conductivity types being opposite conductivity types;
   a surface acoustic wave generator configured to generate a surface acoustic wave (SAW) travelling from the first semiconductor region to the second semiconductor region such that excess carriers from the first semiconductor region are carried by the surface acoustic wave to the second semiconductor region; and
   quantizing means comprising a quantum point contact or a split gate for quantizing a carrier transport caused by the surface acoustic wave, such that a number of carriers introduced into the second semiconductor region is controlled to an accuracy of a single carrier.

2. The photon source of claim 1, wherein the quantizing means are configured such that carriers are introduced one at a time at regular intervals into the second semiconductor region.

3. A method of generating photons, the method comprising the steps of:
   creating a surface acoustic wave (SAW) which travels from a first region having an excess of carriers of a first conductivity type to a second region having excess carriers of a second conductivity type, the first and second conductivity types being opposite conductivity types, such that excess carriers from the first region are carried by the surface acoustic wave to the second region; and
   passing a carrier transport caused by the surface acoustic wave through a quantum point contact or a split gate to quantize said carrier transport, such that a number of carriers introduced into the second region is controlled to an accuracy of a single carrier.

4. The photon source of claim 1, wherein the quantizing means comprises a plurality of restrictions arranged across a path of the SAW.

5. The photon source of claim 1, wherein the a length of the second semiconductor region in a direction of transport of the SAW is configured such that carriers of the first conductivity type only remain in the second semiconductor region for less than a time interval between successive carrier injections into the second semiconductor region.

6. The photon source of claim 5, wherein the carriers of the first type remain in the second semiconductor region at most 50%, of a time delay between successive carrier introductions into the second semiconductor region.

7. The photon source of claim 1, further comprising a third semiconductor region which does not have an excess of carriers of the second conductivity type, provided on an opposing side of the second semiconductor region relative to the first semiconductor region.

8. The photon source of claim 1, wherein excess carriers in the first and second semiconductor regions are provided by a doped barrier layer which has a doping variation in a direction substantially parallel to a propagation direction of the SAW.

9. The photon source of claim 1, wherein excess carriers in the first and second semiconductor regions are provided by a single doped barrier layer which has a doping variation in a direction substantially parallel to a propagating direction of the SAW, and wherein the single doped barrier layer is provided overlying at least two different growth planes and the single doped barrier layer is amphoterically doped such that the doping type of the single doped barrier layer changes over the at least two growth planes.

10. The photon source of claim 1, wherein the quantization means has a smoothly varying opening to a leading front of the SAW.

11. The photon source of claim 1, wherein the carriers in the first semiconductor region are induced by a bias applied to a first gate and the carriers in the second semiconductor region are induced by a bias applied to a second gate, and wherein the first and second semiconductor regions are provided in an active layer overlying a substrate and said first gate is provided on a substrate side of the active layer.

12. The photon source of claim 1, wherein carriers in the first semiconductor region are induced by a bias applied to a first gate, carriers in the second semiconductor region are induced by a bias applied to a second gate, and the first and second gates are provided in the same gate layer.

13. The photon source of claim 1, wherein carriers in the first semiconductor region are induced by a bias applied to a first gate and carriers in the second semiconductor region are induced by a bias applied to a second gate, the first and second gates being provided within the same gate layer which has a doping variation in a direction substantially parallel to a propagation direction of the SAW.

14. The photon source of claim 13, wherein the gate layer is provided overlying at least two different growth planes and the gate layer is amphoterically doped such that the doping type of the gate layer changes over the at least two growth planes.

15. The photon source of claim 1, wherein a gate is provided overlying the second semiconductor region to screen a SAW potential in the second semiconductor region.

16. The photon source of claim 1, wherein the carriers in the second semiconductor region are induced by a bias applied to a second gate and wherein the second gate also functions to screen a SAW potential.

17. The photon source of claim 1, wherein the second semiconductor region is configured to have a higher non-radiative recombination rate than the first semiconductor region.

18. The photon source of claim 1, wherein the second semiconductor region is configured to have a higher radiative recombination rate than the first semiconductor region.

19. The photon source of claim 1, wherein the source is configured to have two channels having different radiative recombination rates and is further configured such that carriers are carried through the quantization means in the first channel during m−1 cycles of the SAW and switched during the m$^{th}$ cycle of the SAW to the second channel in the second semiconductor region for recombination, where m is an integer greater than 1.

20. The photon source of claim 1, wherein the second semiconductor region is located in a microcavity.

21. The photon source of claim 1, further comprising a waveguide for guiding light emitted by the second semiconductor region after recombination.

22. The photon source of claim 1, further comprising a pulse generator configured to provide a pulse bias to the quantizing means such that the quantizing means only transmit carriers every m cycles of the SAW, where m is an integer greater than 1.

23. The photon source of claim 1, further comprising a current splitting device, the current splitting device comprising an input, first and second outputs and a controller configured to select the required output, carriers being provided to the input from the first semiconductor region, wherein carriers emitted from the first output are injected into the second semiconductor region and carriers emitted from the second output are not injected into the second semiconductor region, the controller being configured to emit carriers from the first output every m cycles of the SAW, m being an integer greater than 1.

24. The photon source of claim 1, wherein the quantizing means comprises a quantum point contact.

25. The photon source of claim 1, wherein the quantizing means comprises a split gate.

26. The photon source of claim 5, wherein the carriers of the first type remain in the second semiconductor region at most 10% of a time delay between successive carrier introductions into the second semiconductor region.

27. The photon source of claim 5, wherein the carriers of the first type remain in the second semiconductor region at most 1% of a time delay between successive carrier introductions into the second semiconductor region.

* * * * *